United States Patent
Hu et al.

(10) Patent No.: US 12,156,402 B2
(45) Date of Patent: Nov. 26, 2024

(54) 3D AND FLASH MEMORY DEVICE AND METHOD OF FABRICATING THE SAME

(71) Applicant: MACRONIX International Co., Ltd., Hsinchu (TW)

(72) Inventors: Chih-Wei Hu, Miaoli County (TW); Teng Hao Yeh, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 422 days.

(21) Appl. No.: 17/721,222

(22) Filed: Apr. 14, 2022

(65) Prior Publication Data
US 2023/0337422 A1 Oct. 19, 2023

(51) Int. Cl.
*H10B 41/27* (2023.01)
*G11C 16/04* (2006.01)
*H10B 41/10* (2023.01)
*H10B 43/10* (2023.01)
*H10B 43/27* (2023.01)

(52) U.S. Cl.
CPC ......... *H10B 41/27* (2023.02); *G11C 16/0483* (2013.01); *H10B 41/10* (2023.02); *H10B 43/10* (2023.02); *H10B 43/27* (2023.02)

(58) Field of Classification Search
CPC ........ H10B 41/27; H10B 41/10; H10B 43/10; H10B 43/27; H10B 43/20; G11C 16/0483; G11C 16/0416
See application file for complete search history.

(56) References Cited

U.S. PATENT DOCUMENTS

| | | | |
|---|---|---|---|
| 2020/0013791 A1* | 1/2020 | Or-Bach | H10B 43/20 |
| 2020/0066741 A1* | 2/2020 | Wu | H10B 41/10 |
| 2020/0119046 A1* | 4/2020 | Tang | H10B 43/27 |
| 2020/0295016 A1* | 9/2020 | Harada | H01L 23/5226 |
| 2020/0381450 A1* | 12/2020 | Lue | H10B 43/27 |
| 2022/0013535 A1 | 1/2022 | Lue | |

(Continued)

FOREIGN PATENT DOCUMENTS

| | | |
|---|---|---|
| TW | 202040797 | 11/2020 |
| TW | 202114181 | 4/2021 |

(Continued)

OTHER PUBLICATIONS

"Office Action of Taiwan Counterpart Application", issued on Nov. 21, 2022, p. 1-p. 9.

*Primary Examiner* — S M Sohel Imtiaz
(74) *Attorney, Agent, or Firm* — J.C. PATENTS

(57) ABSTRACT

A 3D AND flash memory device includes a gate stack structure, a channel pillar, a source pillar, a charge storage structure, a first transistor and a second transistor. The gate stack structure is located on a dielectric substrate, wherein the gate stack structure includes a plurality of gate layers and a plurality of insulating layers alternately stacked. The channel pillar extends through the gate stack structure. The source pillar and the drain pillar are disposed in the channel pillar and electrically connected to the channel pillar. The charge storage structure is located between the plurality of gate layers and the channel pillar. The first transistor is located above the gate stack structure and electrically connected to the drain pillar. The second transistor is located above the gate stack structure and electrically connected to the source pillar.

11 Claims, 20 Drawing Sheets

(56) References Cited

U.S. PATENT DOCUMENTS

2022/0293180 A1\* 9/2022 Lee .................... G11C 16/0483
2023/0223081 A1\* 7/2023 Inuzuka ................ H10B 43/27
                                                    365/185.01

FOREIGN PATENT DOCUMENTS

| TW | 202125723 | 7/2021 |
| TW | 202201752 | 1/2022 |

\* cited by examiner

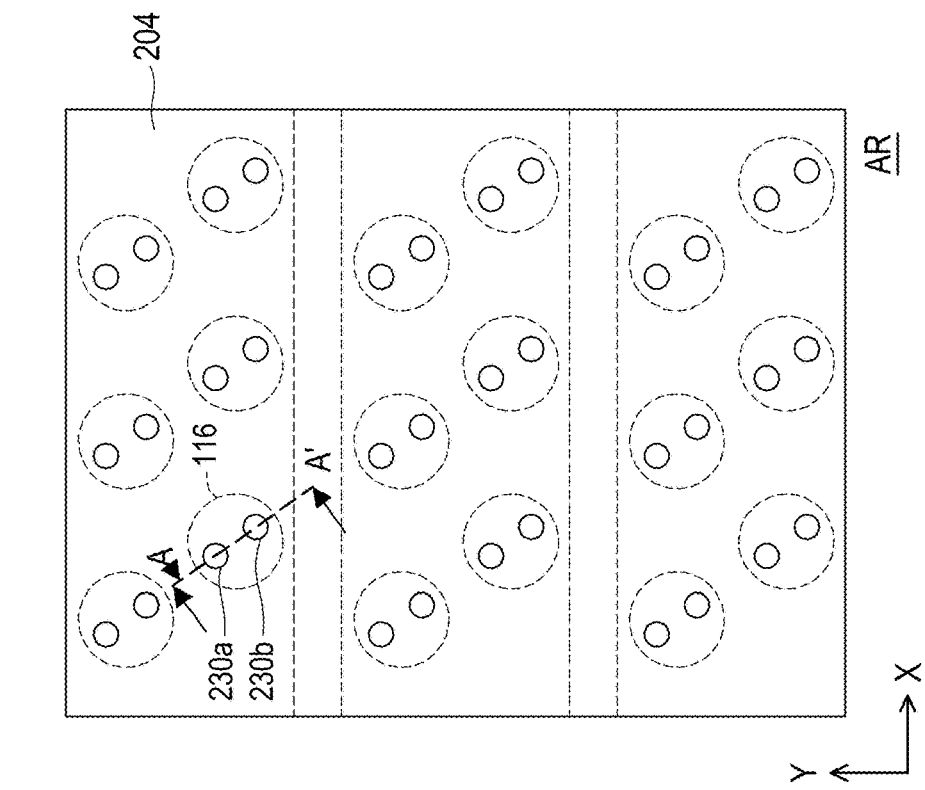
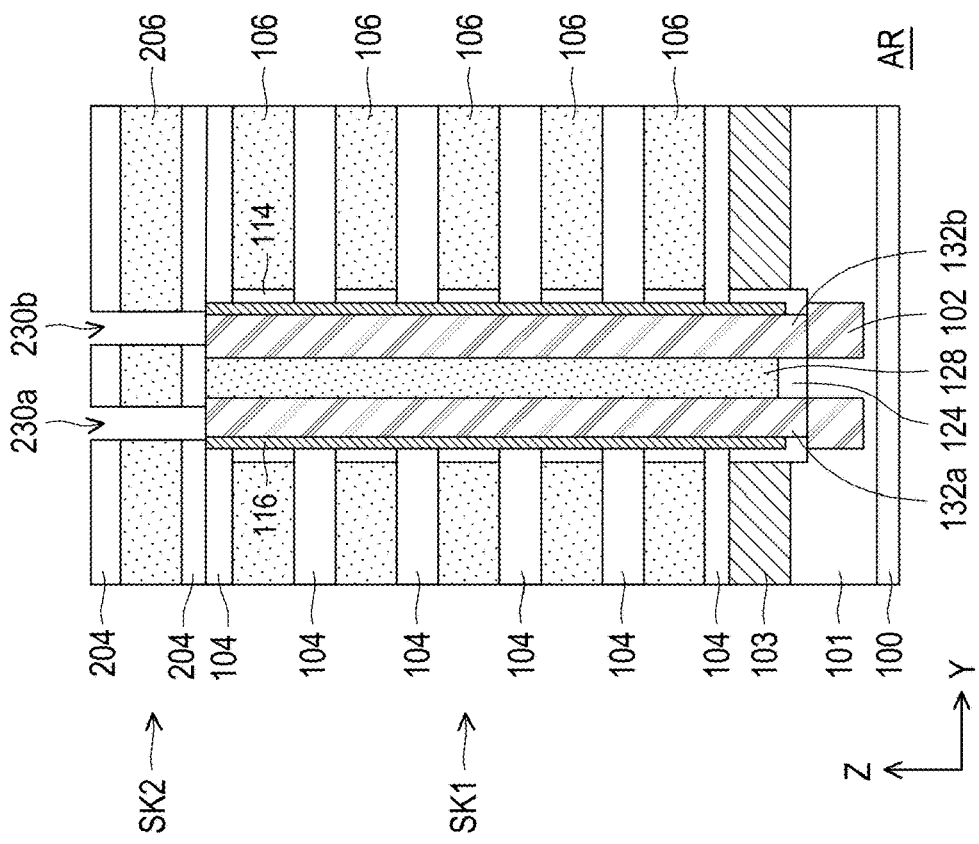

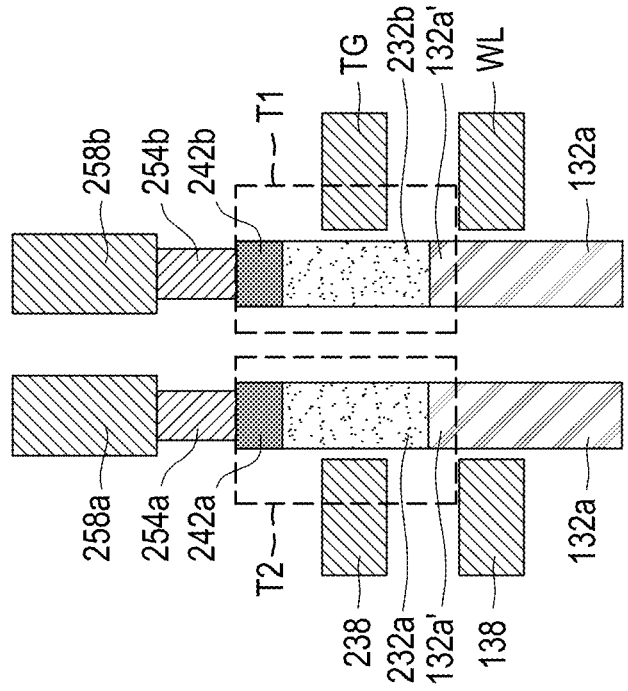
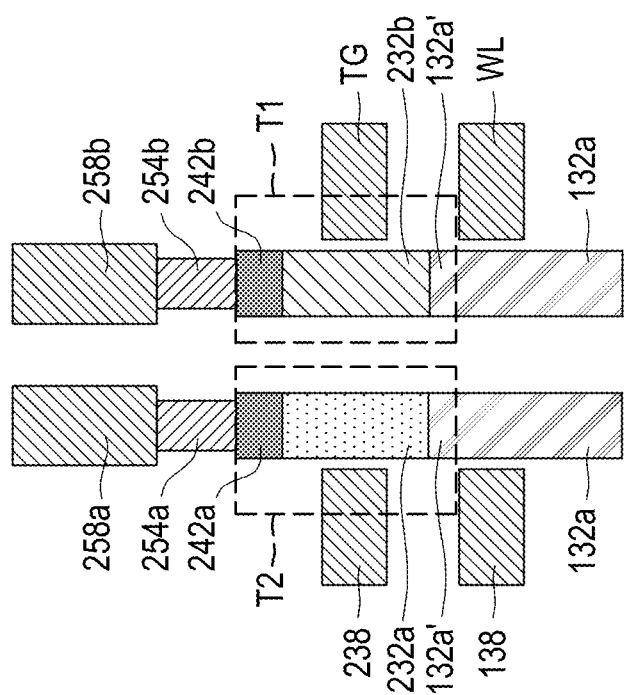

3D AND FLASH MEMORY DEVICE AND METHOD OF FABRICATING THE SAME

BACKGROUND

Technical Field

The embodiment of the disclosure relates to a semiconductor device and a method of fabricating the same, and particularly to a three-dimensional (3D) AND flash memory device and a method of fabricating the same.

Description of Related Art

Since a non-volatile memory has the advantage that stored data does not disappear at power-off, it becomes a widely used memory for a personal computer or other electronics equipment. Currently, the 3D memory commonly used in the industry includes a NOR memory and a NAND memory. In addition, another 3D memory is an AND memory, which may be applied to a multi-dimensional memory array with high integration and high area utilization, and has an advantage of a fast operation speed. Therefore, the development of a 3D AND flash memory device has gradually become the current trend.

SUMMARY

The disclosure provides a 3D AND flash memory device to avoid read errors.

The disclosure provides a method of fabricating a 3D AND flash memory device. The method of the disclosure may be integrated with the existing process to form a transistor serving as a switch in a memory array, so as to avoid read errors.

A 3D AND flash memory device according to an embodiment of the disclosure includes a gate stack structure, a channel pillar, a source pillar, a charge storage structure, a first transistor and a second transistor. The gate stack structure is located on a dielectric substrate, wherein the gate stack structure includes a plurality of gate layers and a plurality of insulating layers alternately stacked. The channel pillar extends through the gate stack structure. The source pillar and the drain pillar are disposed in the channel pillar and electrically connected to the channel pillar. The charge storage structure is located between the plurality of gate layers and the channel pillar. The first transistor is located above the gate stack structure and electrically connected to the drain pillar. The second transistor is located above the gate stack structure and electrically connected to the source pillar.

A 3D AND flash memory device according to an embodiment of the disclosure includes a first block, a second block, a bit line and a source line. The first block includes a plurality of first memory cells, a first transistor and a second transistor. The first memory cells are connected in parallel to form a first memory string. The first transistor is connected in series with a drain of the first memory string. The second transistor is connected in series with a source of the first memory string. The second block includes a plurality of second memory cells, a third transistor and a fourth transistor. The second memory cells are connected in parallel to form a second memory string. The third transistor is connected in series with a drain of the second memory string. The fourth transistor is connected in series with a source of the second memory string. The bit line connects a drain region of the first transistor of the first block and a drain region of the third transistor of the second block. The source line connects a source region of the second transistor of the first block and a source region of the fourth transistor of the second block.

A 3D AND flash memory device according to an embodiment of the disclosure includes a plurality of first memory cells, a plurality of second memory cells, a bit line, a source line, a first transistor, a second transistor, a third transistor and a fourth transistor. The first memory cells are connected in parallel to form a first memory string. The second memory cells are connected in parallel to form a second memory string. The bit line is connected to the first memory string. The source line is connected to the second memory string. The first transistor is electrically connected to a drain of the first memory string and the bit line. The second transistor is electrically connected to a source of the first memory string and the source line. The third transistor is electrically connected to a drain of the second memory string and the bit line. The fourth transistor is electrically connected to a source of the second memory string and the source line.

A method of fabricating a 3D AND flash memory device according to an embodiment of the disclosure includes the following steps. A first stack structure is formed on a dielectric substrate, wherein the first stack structure includes a plurality of first interlayers and a plurality of first insulating layers alternately stacked. A channel pillar extending through the first stack structure is formed. A source pillar and a drain pillar are formed in the channel pillar to electrically connect to the channel pillar. A second stack structure is formed on the first stack structure, wherein the second stack structure includes a plurality of second insulating layers and at least one second interlayer alternately stacked. A first channel plug and a second channel plug extending through the second stack structure are formed, wherein the first channel plug is landed on and electrically connected to the drain pillar, and the second channel plug is landed on and electrically connected to the source pillar. The plurality of first interlayers and the at least one second interlayer are partially removed, to form a plurality of first horizontal openings and at least one second horizontal opening. A gate dielectric layer is formed in the at least one second horizontal opening. A plurality of first gate layers are formed in the plurality of first horizontal openings, and at least one second gate layer is formed in a remaining space of the at least one second horizontal opening. A plurality of charge storage structures are formed between the plurality of first gate layers and the channel pillar. A first doping region is formed in the first channel plug and a second doping region is formed in the second channel plug.

A method of fabricating a 3D AND flash memory device of the disclosure may be integrated with the existing process to form a plurality of transistors in a memory array. The transistors serve as switches, so as to avoid read errors.

BRIEF DESCRIPTION OF THE DRAWINGS

FIG. 2A to FIG. 2L show cross-sectional views of a manufacturing process of a 3D AND flash memory device in according to an embodiment of the present disclosure.

FIG. 3A to FIG. 3L are top views of FIG. 2A to FIG. 2L.

FIG. 4A to FIG. 4E are cross-sectional views of various combinations of transistors disposed above the memory array in according to an embodiment of the present disclosure.

DESCRIPTION OF THE EMBODIMENTS

Figure 1A:
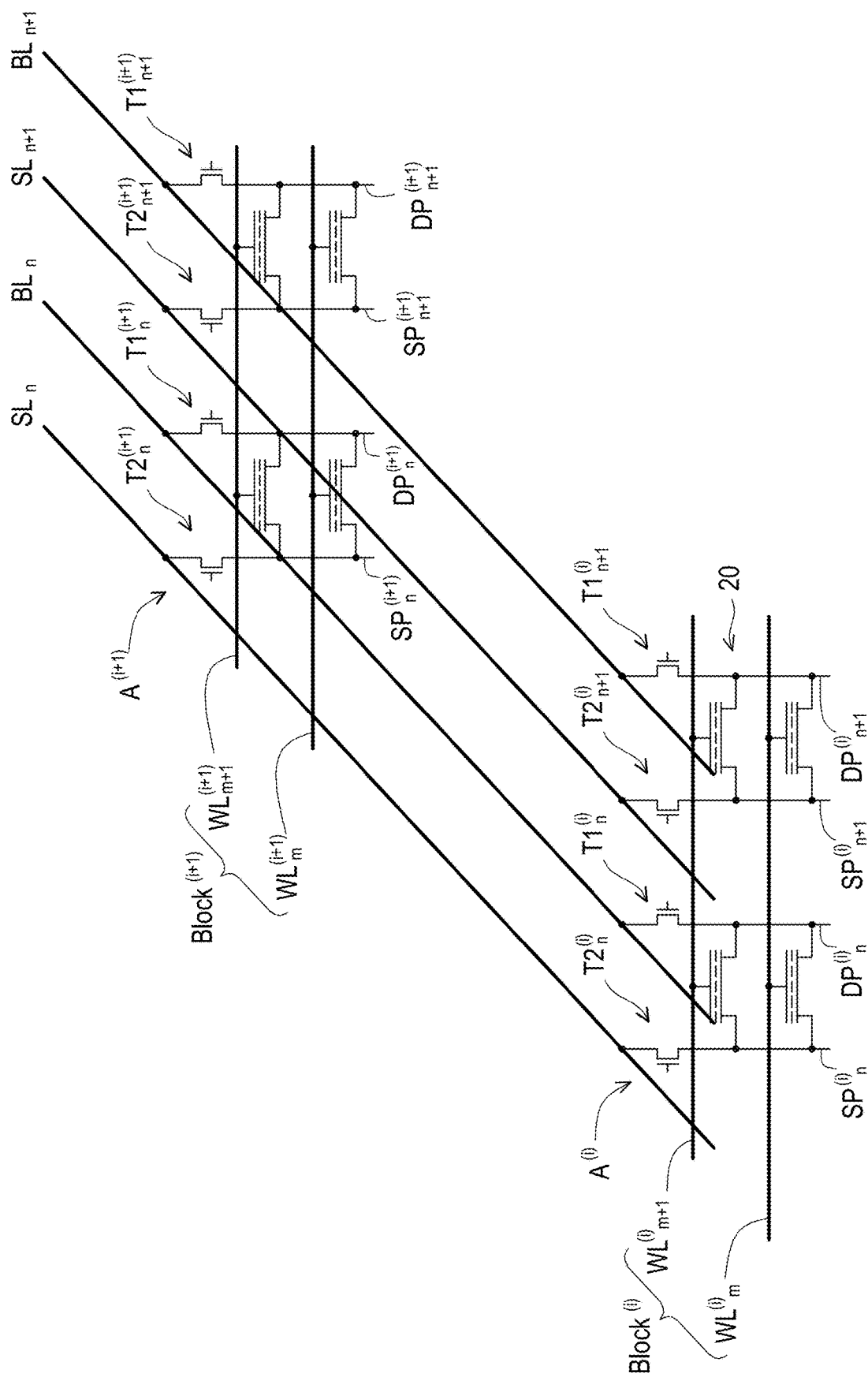
FIG. 1A shows a circuit diagram of a 3D AND flash memory array according to some embodiments in according to the present disclosure.
Figure 1B:
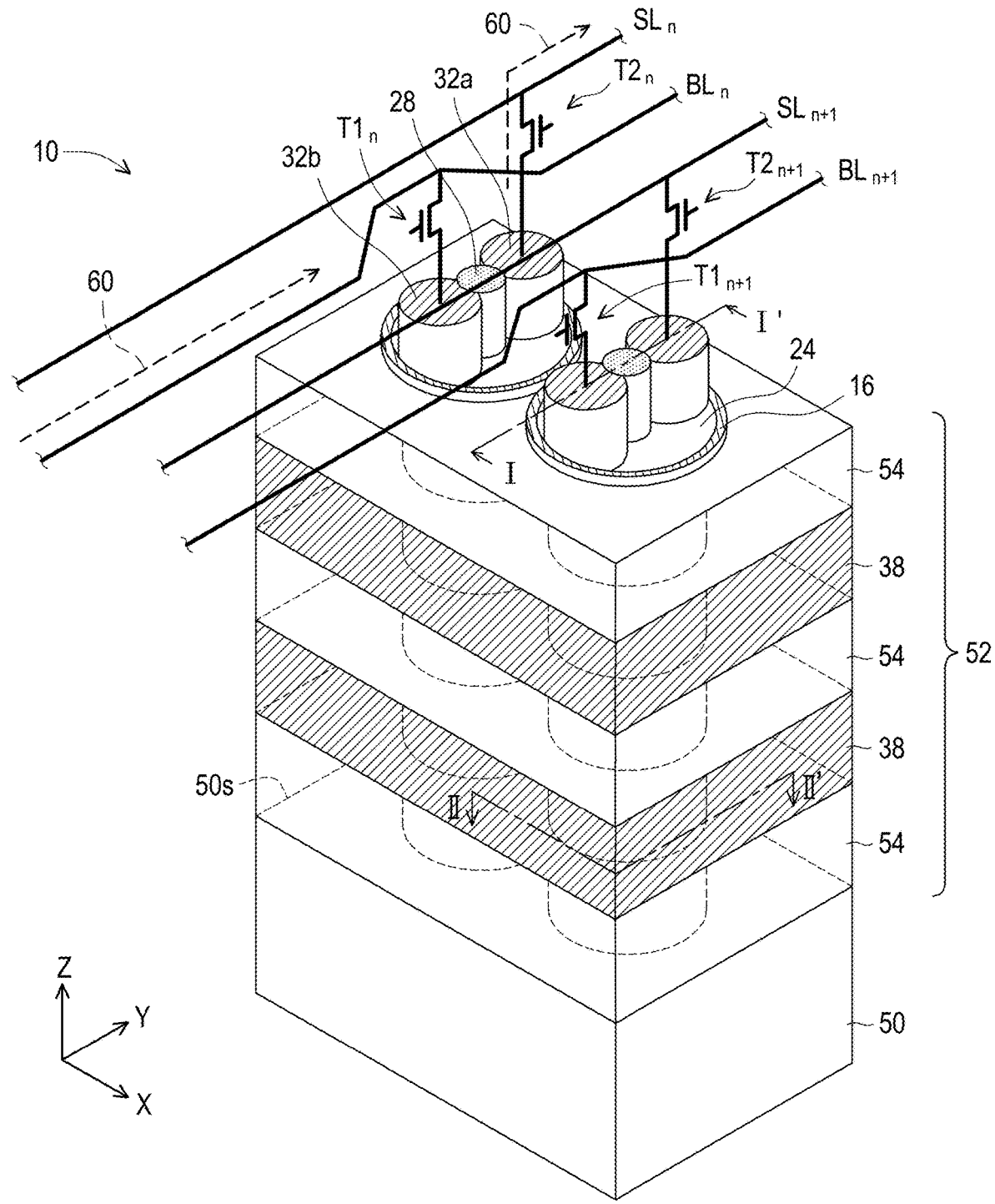
FIG. 1B shows a partial simplified perspective view of the memory array in FIG. 1A.
Figure 1C:
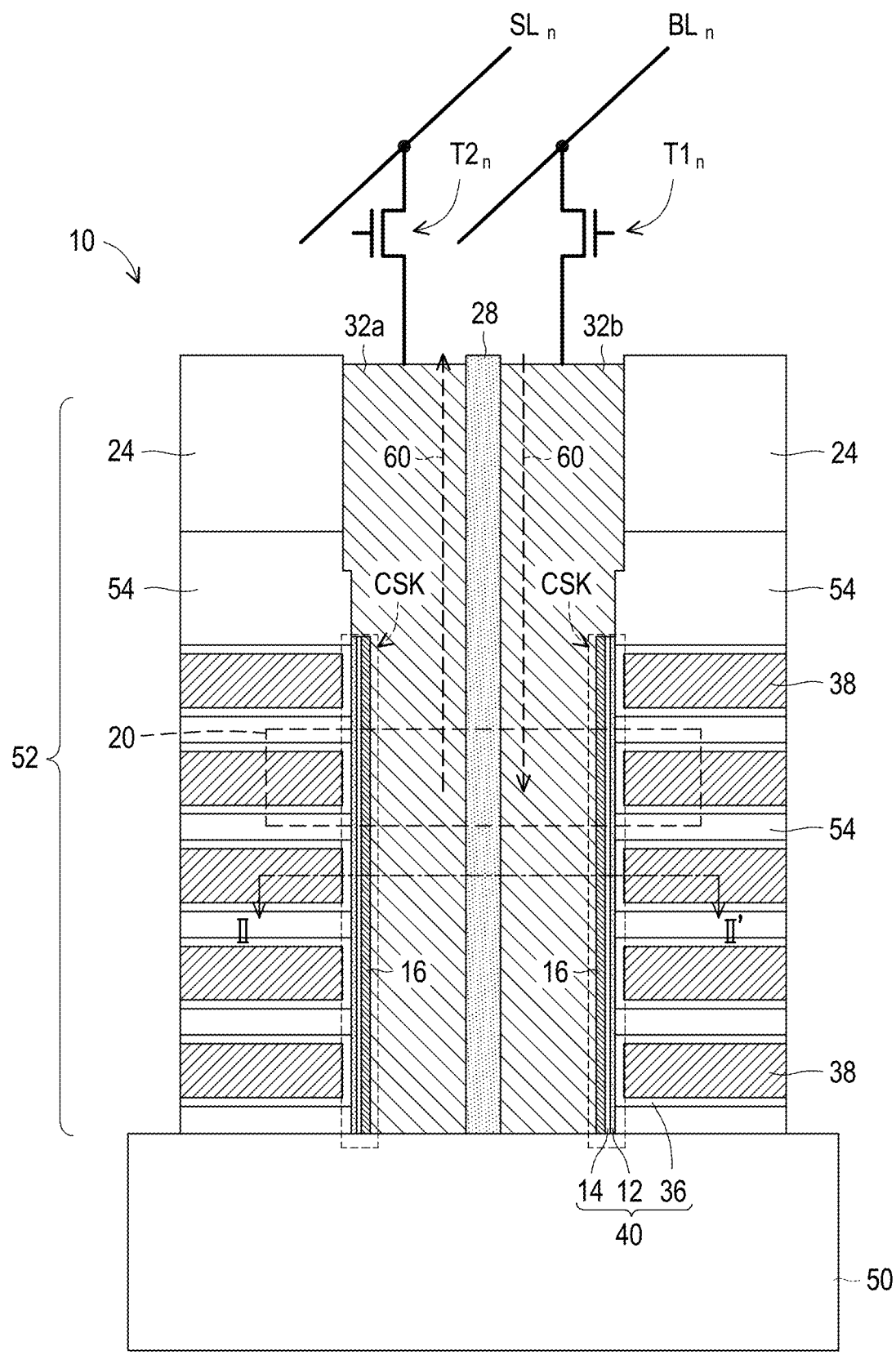
FIG. 1C and FIG. 1D show cross-sectional views taken along line I-I' of FIG. 1B.
Figure 1D:
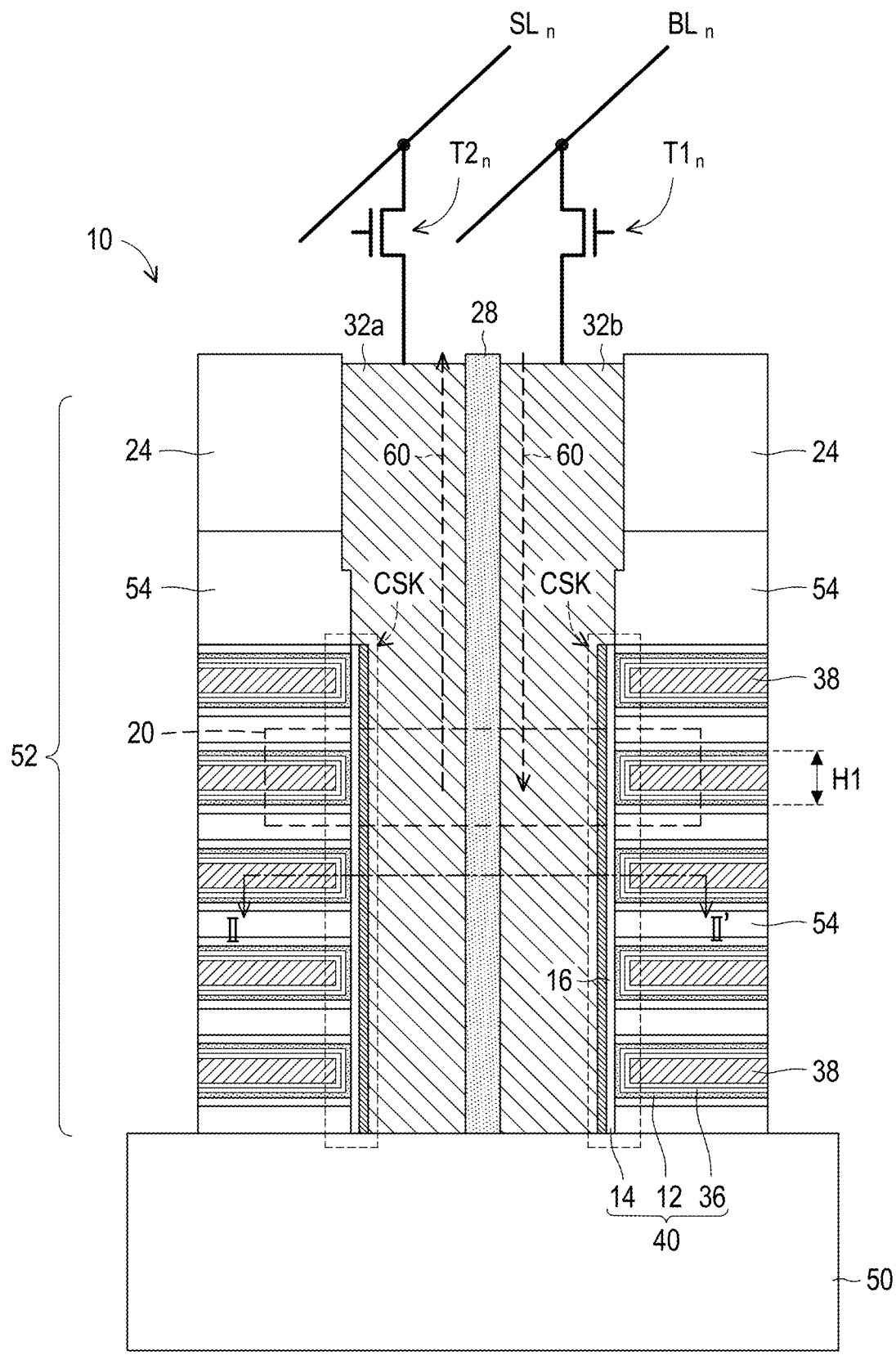
Figure 1E:
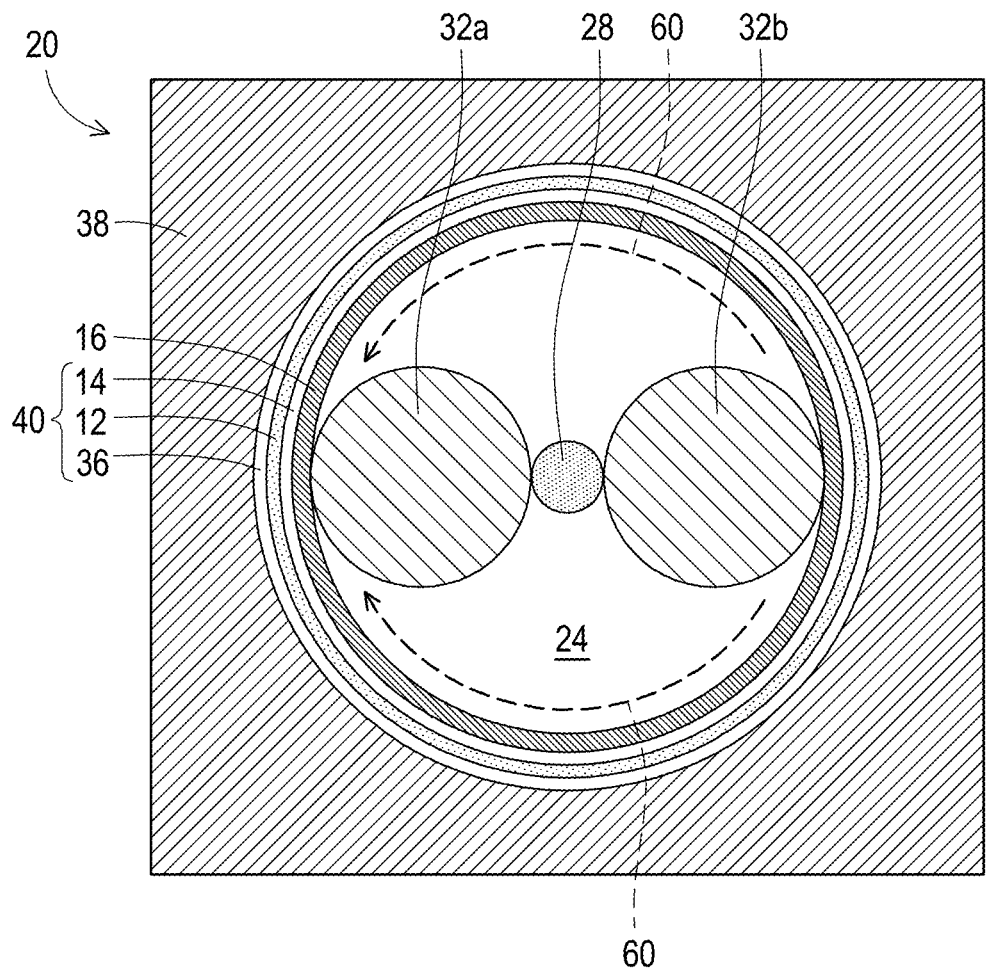
FIG. 1E shows a top view of line II-II' of FIG. 1C and FIG. 1D.

FIG. 1A shows a circuit diagram of a 3D AND flash memory array according to some embodiments in according to the present disclosure. FIG. 1B shows a partial simplified perspective view of the memory array in FIG. 1A. FIG. 1C and FIG. 1D show cross-sectional views taken along line I-I' of FIG. 1B. FIG. 1E shows a top view of line II-II' of FIG. 1C and FIG. 1D.

FIG. 1A shows a schematic view of two blocks $BLOCK^{(i)}$ and $BLOCK^{(i+1)}$ of a vertical AND memory array 10 arranged in rows and columns. The block $BLOCK^{(i)}$ includes a memory array $A^{(i)}$. A row (e.g., an $(m+1)^{th}$ row) of the memory array $A^{(i)}$ is a set of AND memory cells 20 having a common word line (e.g., $WL^{(i)}_{m+1}$). The AND memory cells 20 of the memory array $A^{(i)}$ in each row (e.g., the $(m+1)^{th}$ row) correspond to a common word line (e.g., $WL^{(i)}_{m+1}$) and are coupled to different source pillars (e.g., $SP^{(i)}_n$ and $SP^{(i)}_{n+1}$) and drain pillars (e.g., $DP^{(i)}_n$ and $DP^{(i)}_{n+1}$), so that the AND memory cells 20 are logically arranged in a row along the common word line (e.g., $WL^{(i)}_{m+1}$).

A column (e.g., an $n^{th}$ column) of the memory array $A^{(i)}$ is a set of AND memory cells 20 having a common source pillar (e.g., $SP^{(i)}_n$) and a common drain pillar (e.g., $DP^{(i)}_n$). The AND memory cells 20 of the memory array $A^{(i)}$ in each column (e.g., the $n^{th}$ column) correspond to different word lines (e.g., $WL^{(i)}_{m+1}$ and $WL^{(i)}_m$) and are coupled to a common source pillar (e.g., $SP^{(i)}_n$) and a common drain pillar (e.g., $DP^{(i)}_n$). Hence, the AND memory cells 20 of the memory array $A^{(i)}$ are logically arranged in a column along the common source pillar (e.g., $SP^{(i)}_n$) and the common drain pillar (e.g., $DP^{(i)}_n$). In the physical layout, according to the fabrication method as applied, the columns or rows may be twisted and arranged in a honeycomb pattern or other patterns for high density or other reasons.

In FIG. 1A, in the block $BLOCK^{(i)}$, the AND memory cells 20 in the $n^{th}$ column of the memory array $A^{(i)}$ share a common source pillar (e.g., $SP^{(i)}_n$) and a common drain pillar (e.g., $DP^{(i)}_n$). The AND memory cells 20 in an $(n+1)^{th}$ column share a common source pillar (e.g., $SP^{(i)}_{n+1}$) and a common drain pillar (e.g., $DP^{(i)}_{n+1}$).

The common source pillar (e.g., $SP^{(i)}_n$) is coupled to a common source line (e.g., $SL_n$) and the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$) and the common drain pillar (e.g., $DP^{(i)}_{n+1}$) is coupled to a common bit line (e.g., $BL_{n+1}$).

Likewise, the block $BLOCK^{(i+1)}$ includes a memory array $A^{(i+1)}$, which is similar to the memory array $A^{(i)}$ in the block $BLOCK^{(i)}$. A row (e.g., an $(m+1)^{th}$ row) of the memory array $A^{(i+1)}$ is a set of AND memory cells 20 having a common word line (e.g., $WL^{(i+1)}_{m+1}$). The AND memory cells 20 of the memory array $A^{(i+1)}$ in each row (e.g., the $(m+1)^{th}$ row) correspond to a common word line (e.g., $WL^{(i+1)}_{m+1}$) and are coupled to different source pillars (e.g., $SP^{(i+1)}_n$ and $SP^{(i+1)}_{n+1}$) and drain pillars (e.g., $DP^{(i+1)}_n$ and $DP^{(i+1)}_{n+1}$). A column (e.g., an $n^{th}$ column) of the memory array $A^{(i+1)}$ is a set of AND memory cells 20 having a common source pillar (e.g., $SP^{(i+1)}_n$) and a common drain pillar (e.g., $DP^{(i+1)}_n$). The AND memory cells 20 are integrated and connected in parallel, and thus may be also referred to as a memory string. The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_m$) and are coupled to a common source pillar (e.g., $SP^{(i+1)}_n$) and a common drain pillar (e.g., $DP^{(i+1)}_n$). Hence, the AND memory cells 20 of the memory array $A^{(i+1)}$ are logically arranged in a column along the common source pillar (e.g., $SP^{(i+1)}_n$) and the common drain pillar (e.g., $DP^{(i+1)}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array $A^{(i+1)}$ of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B and FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The memory array 10 may include a gate stack structure 52, a plurality of channel rings 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure 52 is formed on the dielectric substrate 50 in the array region (not shown) and the staircase region (not shown). The gate stack structure 52 includes a plurality of gate layers (also referred to as word lines) 38 and a plurality of insulating layer 54 vertically stacked on a surface 50s of the dielectric substrate 50. In a direction Z, the gate layers 38 are electrically isolated from each other by the insulating layer 54 disposed therebetween. The gate layers 38 extend in a direction parallel to the surface 50s of the dielectric substrate 50. The gate layers 38 in the staircase region may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel rings 16 stacked along a direction Z. In some embodiments, each of the channel rings 16 has an annular shape from a top view. A material of the channel rings includes a semiconductor material, such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b and the insulating pillar 28 are each extend in a direction (i.e., the direction Z) perpendicular to the gate layer 38. The first conductive pillar 32a and the second conductive pillar 32b are separated from each other by the insulating pillar 28. The first conductive pillar 32a and the second conductive pillar 32b are electrically connected to the channel rings 16. The first conductive pillar 32a and the second conductive pillar 32b include doped polysilicon or metal materials. The insulating pillar 28 is, for example, silicon nitride.

Referring to FIG. 1C and FIG. 1D, the charge storage structures 40 are disposed between the channel rings 16 and the gate layers 38. Each of the charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1D, the charge storage structure 40 (the tunneling layer 14, the charge storage layer 12, and the blocking layer 36) surrounds the gate layer 38.

Referring to FIG. 1E, a charge storage structure 40, a channel ring 16, a source pillar 32a, and a drain pillar 32b are surrounded by a gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel ring 16, electrons may be transferred along the channel ring 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

Referring to FIG. 1A and FIG. 1B, during operation, a voltage is applied to a selected word line (gate layer) 38; for example, when a voltage higher than a corresponding threshold voltage ($V_{th}$) of the corresponding memory cell 20 is applied, the channel ring 16 intersecting the selected word line 38 is turned on to allow a current to enter the drain pillar 32b from the bit line $BL_n$ or $BL_{n+1}$ (shown in FIG. 1B), flow to the source pillar 32a via the turned-on channel region (e.g., in a direction indicated by arrow 60), and finally flow to the source line $SL_n$ or $SL_{n+1}$ (shown in FIG. 1B).

Referring to FIG. 1A, in some embodiments of the disclosure, transistors $T2^{(i)}_n$ and $T2^{(i)}_{n+1}$ are further disposed between the source line $SL_n$ and the source pillars $SP^{(i)}_n$ and $SP^{(i)}_{n+1}$ of the memory array. Transistors $T2^{(i+1)}_n$ and $T2^{(i+1)}_{n+1}$ are further disposed between the source line $SL_{n+1}$ and the source pillars $SP^{(i+1)}_n$ and $SP^{(i+1)}_{n+1}$ of the memory array. Transistors $T1^{(i)}_n$ and $T1^{(i)}_{n+1}$ are further disposed between the bit line $BL_n$ and the drain pillars $DP^{(i)}_n$ and $DP^{(i)}_{n+1}$ of the memory array. Transistors $T1^{(i+1)}_n$ and $T1^{(i+1)}_{n+1}$ are further disposed between the bit line $BL_{n+1}$ and the drain pillars $DP^{(i+1)}_n$ and $DP^{(i+1)}_{n+1}$ of the memory array.

Referring to FIG. 1B, FIG. 1C and FIG. 1D, a transistor $T2_n$ is further disposed between the source line $SL_n$ and the source pillar 32a of the memory array. A transistor $T2_{(n+1)}$ is further disposed between source line $SL_{n+1}$ and the source pillar 32a of the memory array. A transistor $T1_n$ is further disposed between the bit line $BL_n$ and the drain pillar 32b of the memory array. A transistor $T1_{(n+1)}$ is further disposed between the bit line $BL_{n+1}$ and the drain pillar 32b of the memory array. The transistors $T1^{(i)}_n$, $T1^{(i)}_{n+1}$, $T1^{(i+1)}_n$, $T1^{(i+1)}_{n+1}$, $T1_n$, $T1_{n+1}$, $T2^{(i)}_n$, $T2^{(i)}_{n+1}$, $T2^{(i+1)}_n$, $T2^{(i+1)}_{n+1}$, $T2_n$, $T2_{n+1}$ may serve as switches, so as to make the operation (such as reading) of the memory cell more accurate, and reduce or avoid read errors.

FIG. 2A to FIG. 2L are schematic cross-sectional views of a process of fabricating a 3D AND flash memory device according to an embodiment of the disclosure. FIG. 3A to FIG. 3L are top views of FIG. 2A to FIG. 2L. FIG. 2A to FIG. 2L are cross-sectional views taken along line A-A' of FIG. 3A to FIG. 3L.

Figure 3A:
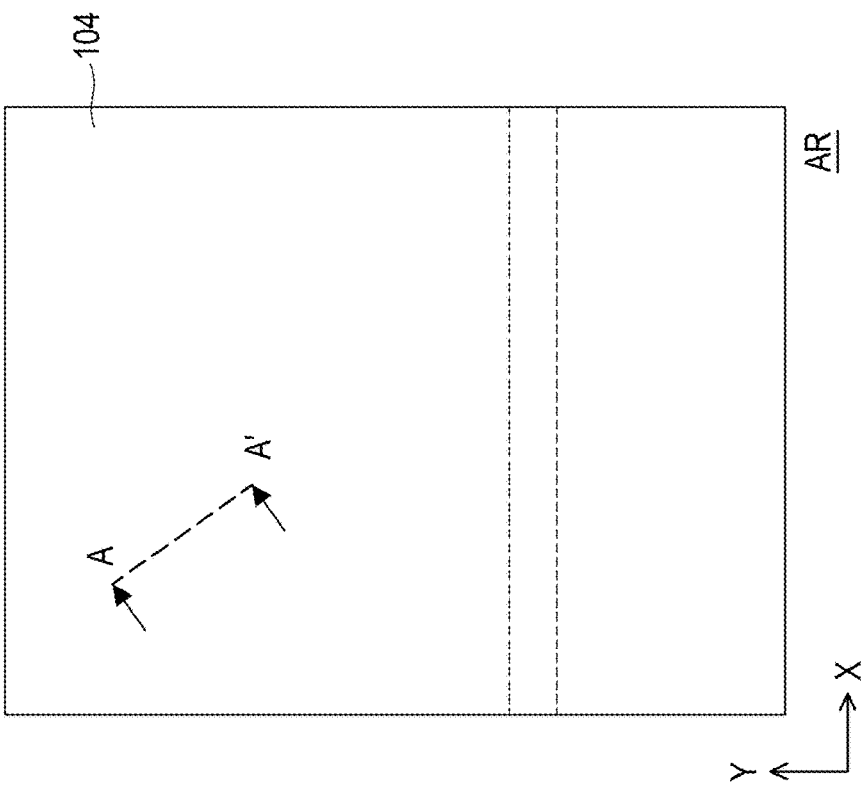
Figure 2A:
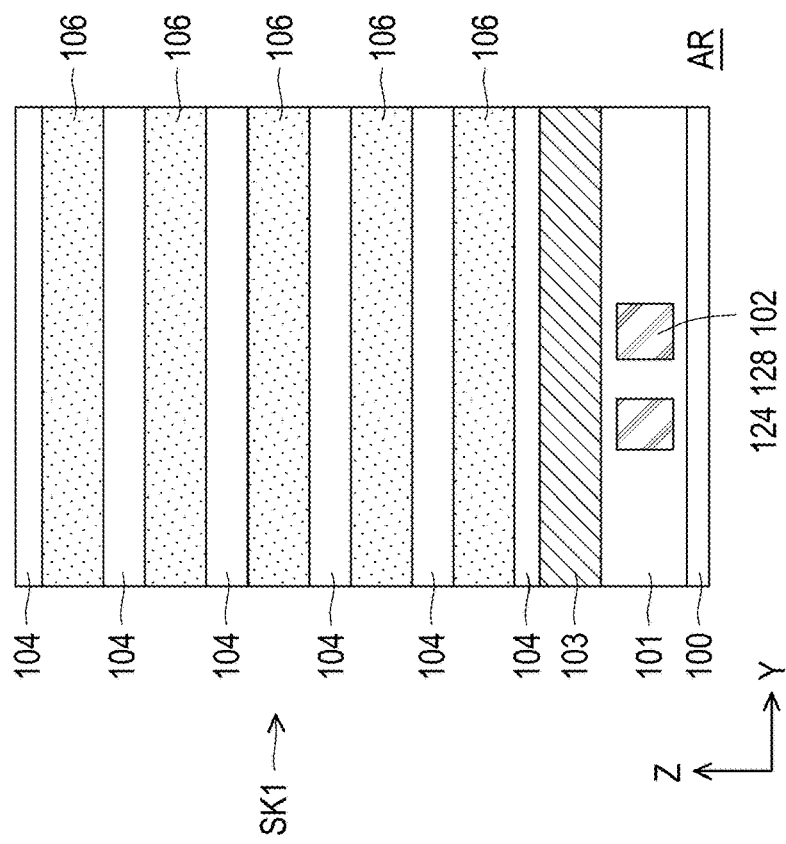

Referring to FIG. 2A and FIG. 3A, a dielectric substrate 100 is provided. The dielectric substrate 100 is, for example, a dielectric layer (e.g., a silicon oxide layer) of a metal interconnect structure formed on a silicon substrate. The dielectric substrate 100 includes an array region AR and a staircase region (not shown). A stack structure SK1 is formed on the dielectric substrate 100 in the array region AR and the staircase region (not shown). The stack structure SK1 may also be referred to as an insulating stack structure SK1. In this embodiment, the stack structure SK1 is composed of insulating layers 104 and interlayers 106 that are alternately stacked alternately stacked on the dielectric substrate 100 in order. In other embodiments, the stack structure SK1 may be composed of interlayers 106 and insulating layers 104 that are alternately stacked on the dielectric substrate 100 in order. In addition, in this embodiment, the uppermost layer of the stack structure SK1 is the insulating layer 104. The insulating layers 104 are silicon oxide layers, for example. The interlayers 106 are silicon nitride layers, for example. The interlayers 106 may serve as sacrificial layers which may be partially or entirely removed in the subsequent process. In this embodiment, the stack structure SK1 has six insulating layers 104 and five interlayers 106, but the disclosure is not limited thereto. In other embodiments, more insulating layers 104 and more interlayers 106 may be formed according to the actual requirements.

In some embodiments, before the stack structure SK1 is formed, an insulating layer 101, a stop layer 102 and a conductive layer 103. The insulating layer 101 is, for example, silicon oxide. The stop layer 102 is formed in the insulating layer 101. The stop layer 102 is, for example, a conductive pattern such as a polysilicon pattern. The conductive layer 103 is a ground layer composed of polysilicon. The conductive layer 103 may be also referred to as dummy gates.

The stack structure SK1 is patterned to form a staircase structure (not shown) in the staircase region (not shown).

Figure 3B:
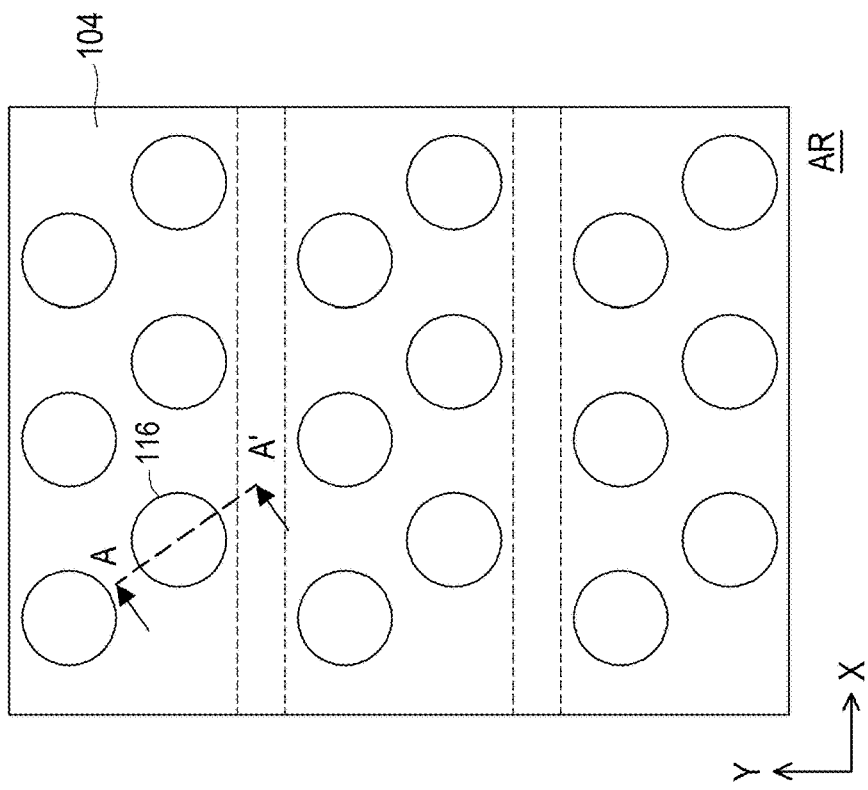
Figure 2B:
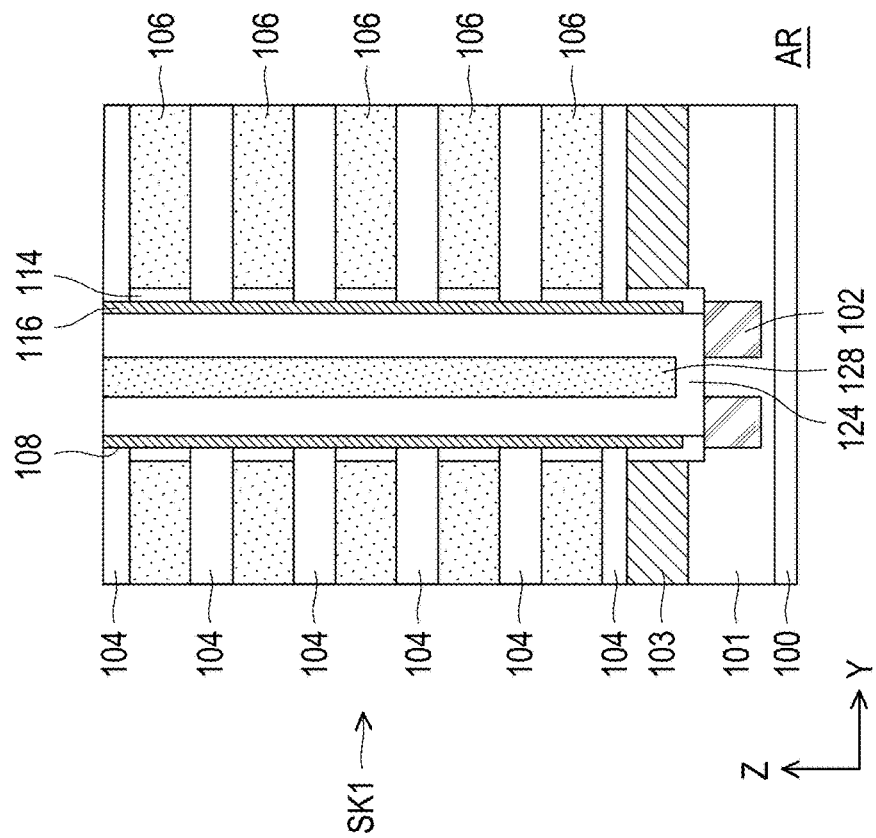

Next, referring to FIG. 2B and FIG. 3B, a plurality of openings 108 are formed in the stack structure SK1 in the array region AR. In this embodiment, the opening 108 extends through the conductive layer 103, and the bottom surface of the opening 108 exposes the stop layer 102 and the insulating layer 101, but the disclosure is not limited thereto. In this embodiment, from a top view, the opening 108 has a circular profile, but the disclosure is not limited thereto. In other embodiments, the opening 108 may have other profile such as a polygonal profile (not shown).

Referring to FIG. 2B and FIG. 3B, a tunneling layer 114 and a channel pillar 116 are formed in the opening 108. The tunneling layer 114 is, for example, a silicon oxide layer. A material of the channel pillar 116 may be semiconductor such as undoped polysilicon. The method of forming the tunneling layer 114 and the channel pillar 116 includes, for example, forming a tunneling material and a channel material on the stack structure SK1 and in the opening 108. The method of forming the tunneling material includes a dry thermal oxidation process, a wet thermal oxidation process or a combination thereof. The dry thermal oxidation process may oxidize the conductive layer 103 to form silicon oxide. The wet thermal oxidation process may oxidize the interlayer 106 to form silicon oxide. The dry thermal oxidation process is, for example, a furnace tube oxidation method. The wet thermal oxidation process is, for example, In-Situ Steam Generation (ISSG). The channel material may be formed by using chemical vapor deposition. Then, an etch-back process is performed to partially remove the tunneling material and the channel material to form the tunneling layer 114 and the channel pillar 116. The tunneling layer 114 and the channel pillar 116 cover the sidewall of the opening 108 and expose the bottom of the opening 108. The tunneling layer 114 and the channel pillar 116 may extend through the stack structure SK1 and extend into the insulating layer 101. In a top view, the channel pillar 116 has, for example, a ring shape, and the channel pillar 116 may be continuous in its extending direction (e.g., in a direction perpendicular to the dielectric substrate 100). In other words, the channel pillar 116 is integral in its extending direction and is not divided into multiple disconnected parts. In other embodiments, the channel pillar 116 is non-continuous in its extending direction (e.g., in a direction perpendicular to the dielectric substrate 100) and is divided into multiple disconnected parts. In some embodiments, the channel pillar 116 may have a circular profile in a top view, but the disclosure is not limited thereto. In other embodiments, the channel pillar 116 may also have other profile such as a polygonal profile in a top view.

Figure 2C:
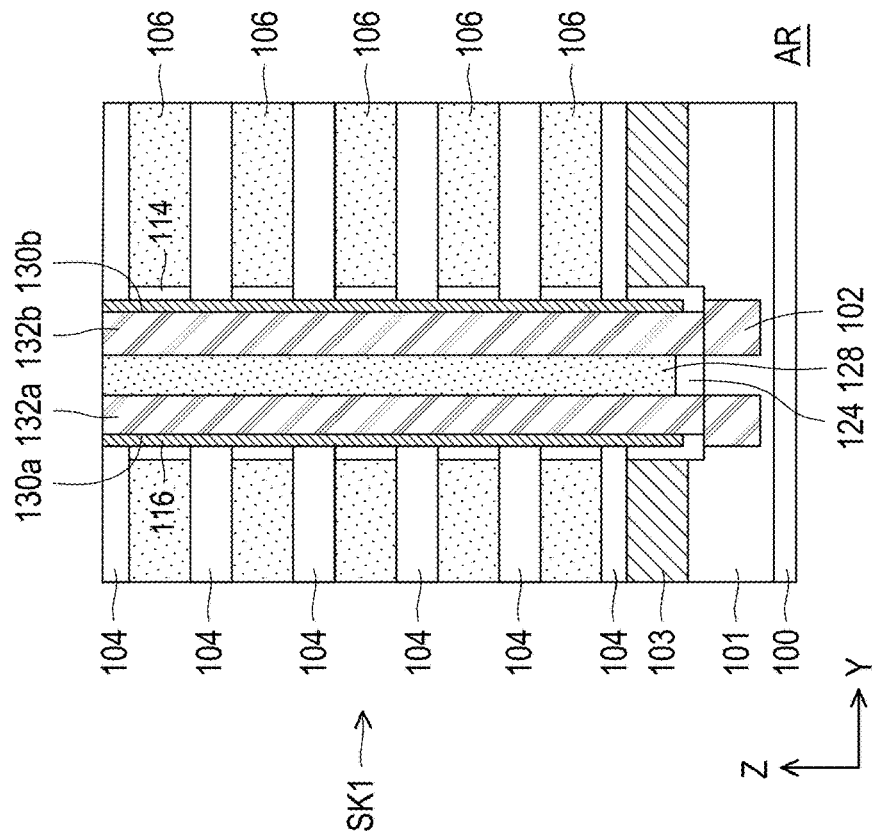
Figure 2D:
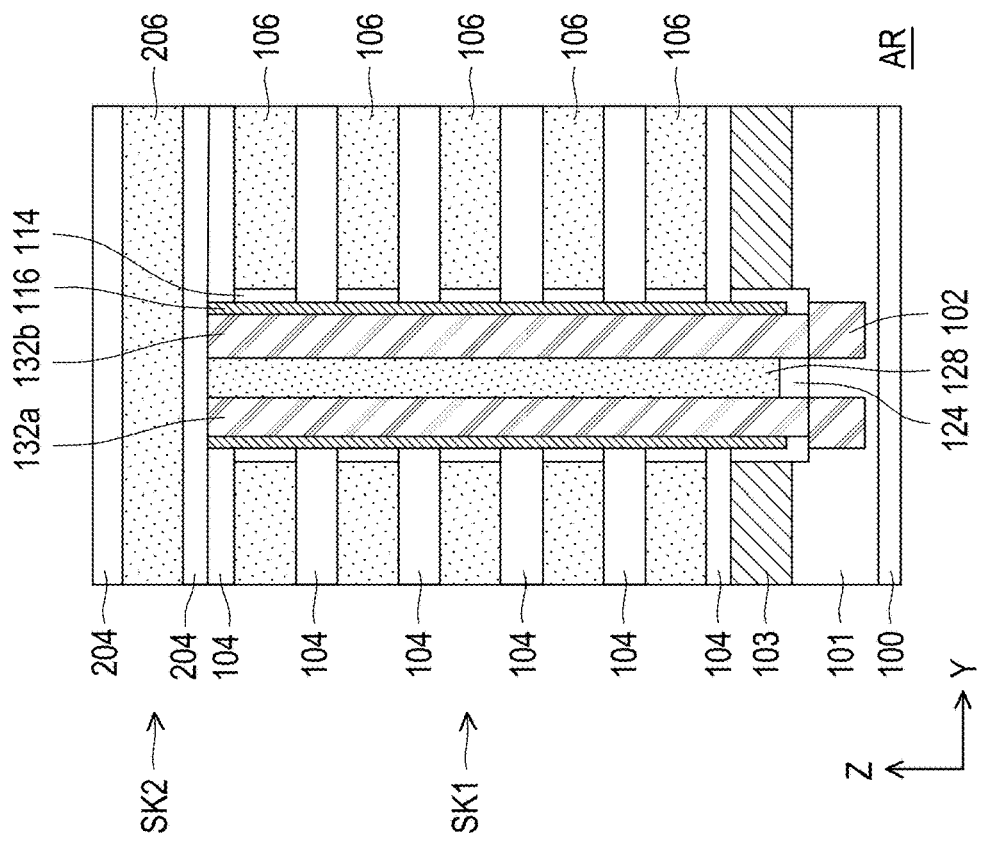
Figure 2F:
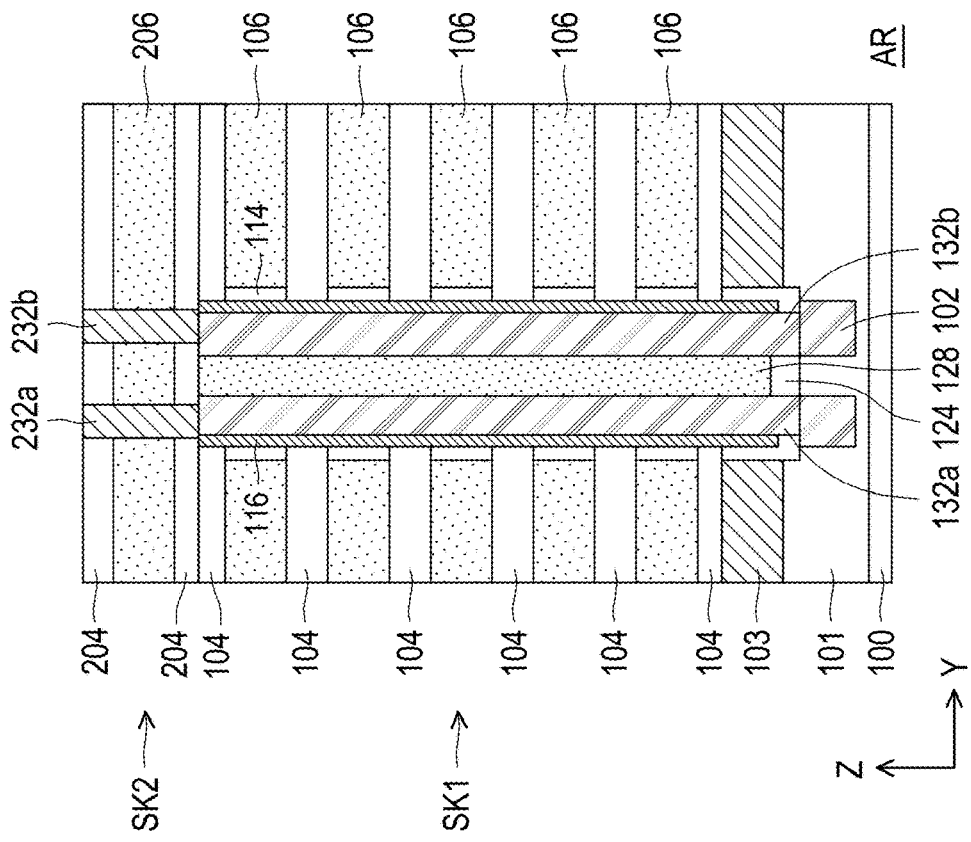
Figure 2H:
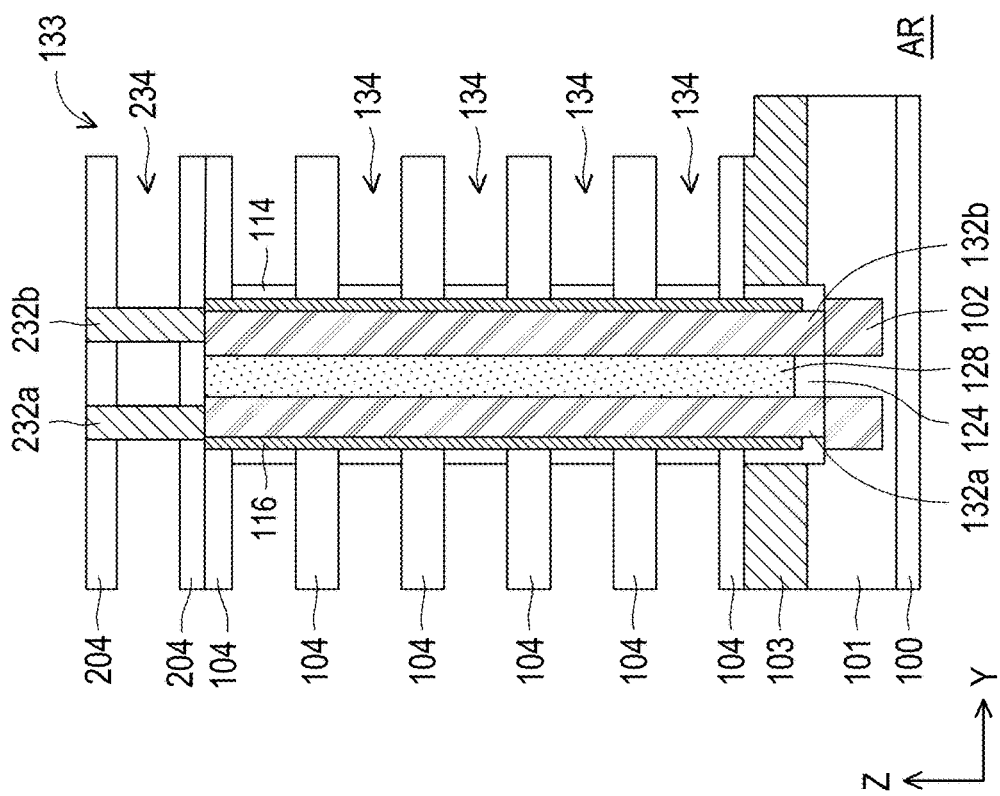
Figure 2I:
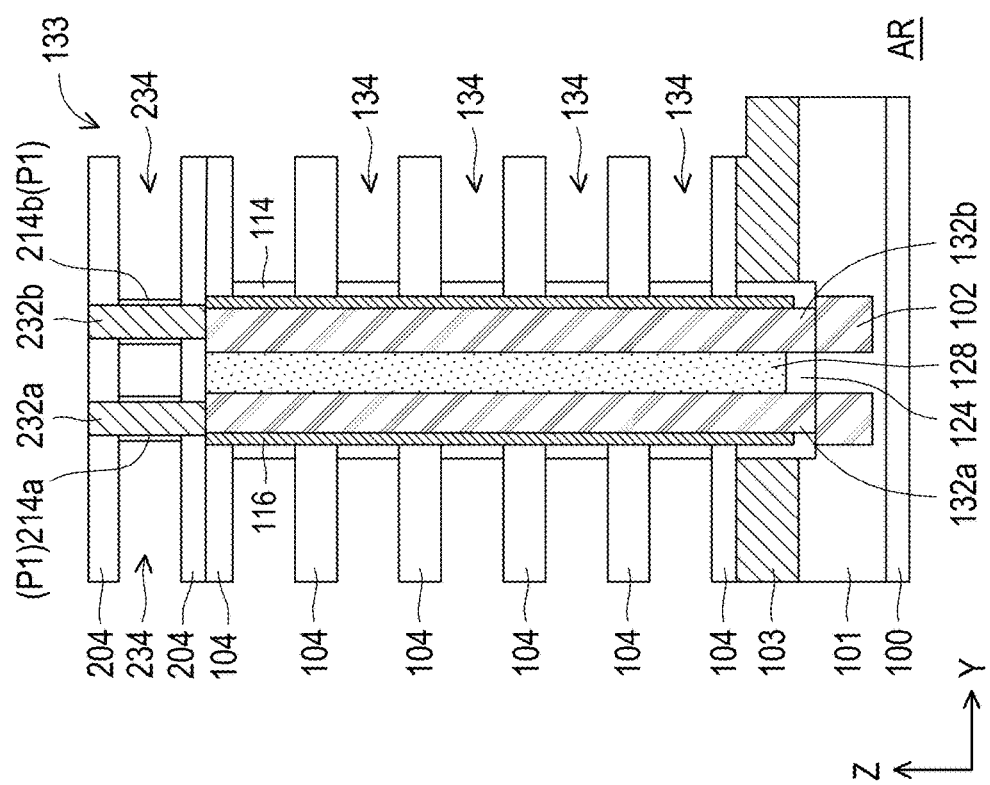
Figure 2J:
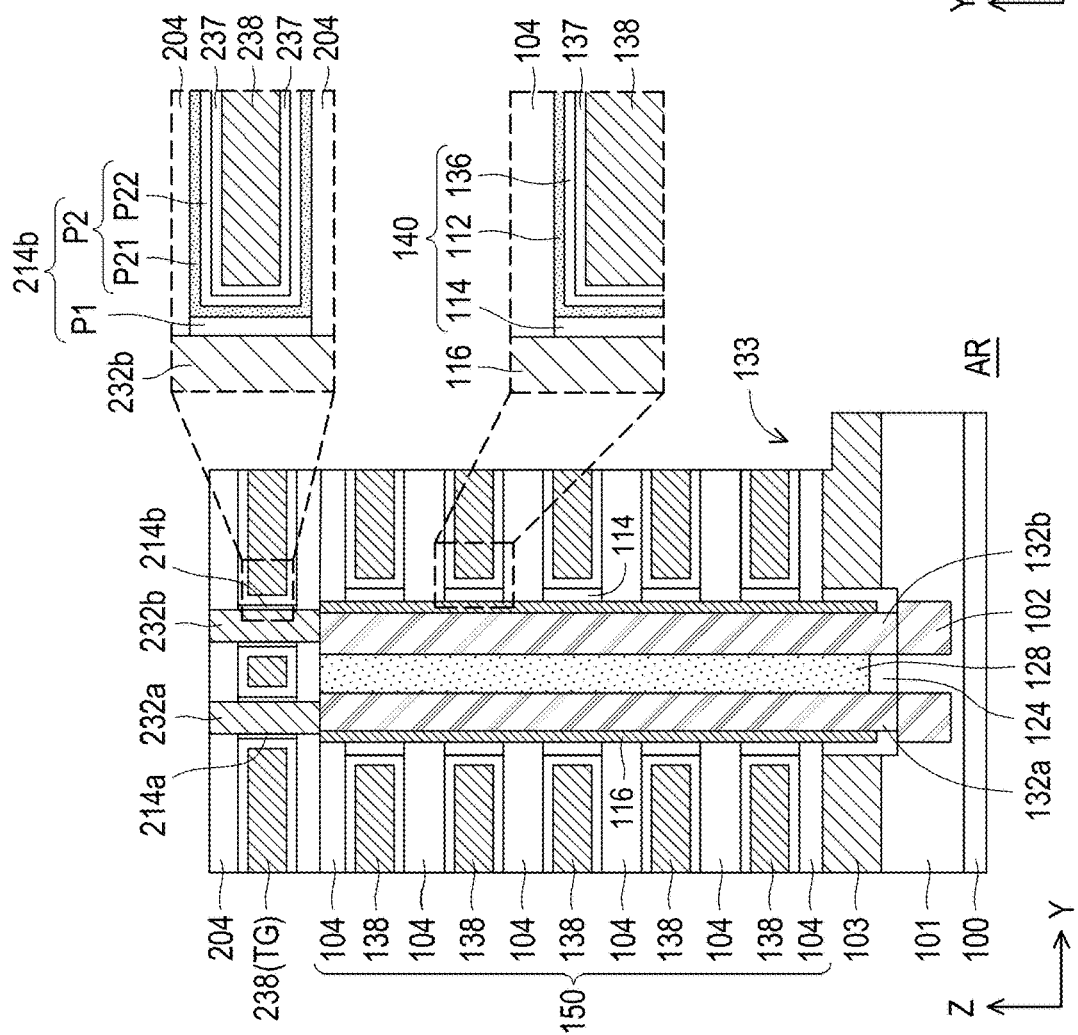

In some embodiments, the tunneling layer 114 of the charge storage structure 140 is formed in the opening 108, and the storage layer 112 and the blocking layer 136 of the charge storage structure 140 are then formed in the horizontal opening 134 during the gate replacement process, as shown in FIG. 2I and FIG. 2J. In other some embodiments, the tunneling layer 114 and the storage layer 112 of the charge storage structure 140 are formed in the opening 108, and the blocking layer 136 of the charge storage structure 140 is then formed in the horizontal opening 134 during the gate replacement process (not shown).

Referring to FIG. 2B and FIG. 3B, an insulating filling layer 124 and insulating pillars 128 are formed in the openings 108. A material of the insulating filling layer 124 is, for example, silicon oxide, and the forming method thereof is, for example, a low temperature thermal oxidation process. A material of the insulating pillar 128 is, for example, silicon nitride, and the forming method thereof is, for example, chemical vapor deposition. Before the insulating filling layer 124 completely fills up the opening 108, an insulating material different from the insulating filling layer 124 is filled into the opening 108 to seal the opening 108 completely. Then, the insulating material is etched back through a dry etching or wet etching process until the surface of the insulating filling layer 124 is exposed. Thereafter, the insulating material remained in the center of the opening 108 forms the insulating pillar 128.

Figure 3C:
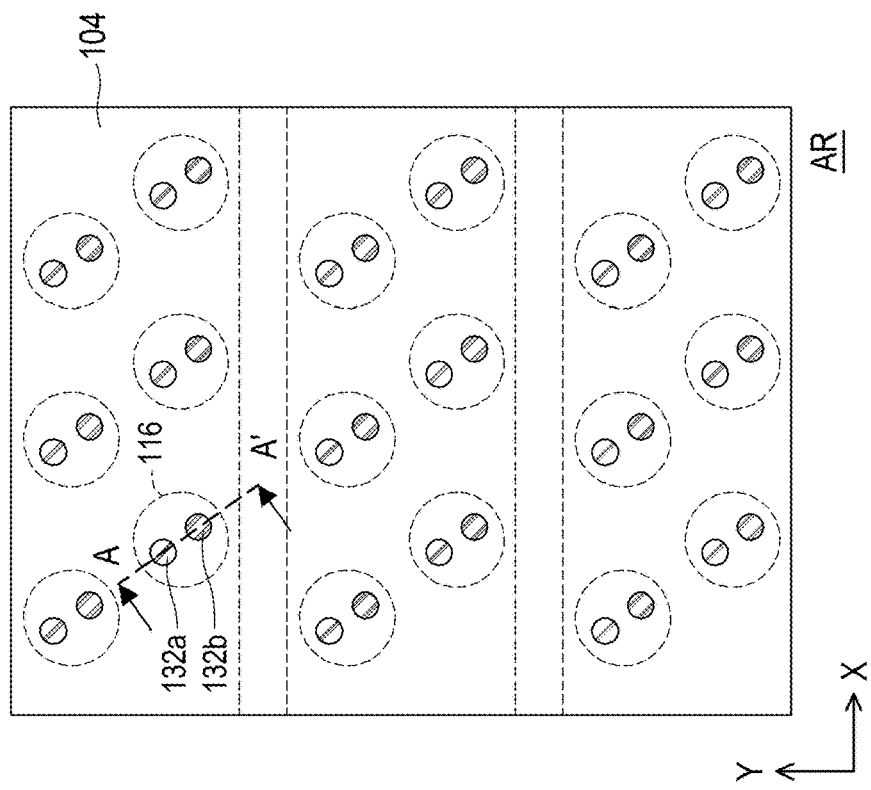

Referring to FIG. 2C and FIG. 3C, a patterning process (e.g., photolithography and etching processes) is performed to form holes 130a and 130b in the insulating filling layer 124. In the etching process, the stop layer 102 may serve as an etching stop layer. Therefore, the formed holes 130a and 130b extend through the stack structure SK1 to expose the stop layer 102. The profiles of the hole patterns defined in the patterning process may be tangent to the profile of the insulating pillar 128. The profiles of the hole patterns defined in the patterning process may also exceed the profile of the insulating pillar 128. Since the etching rate of the insulating pillar 128 is lower than the etching rate of the insulating filling layer 124, the insulating pillar 128 is hardly damaged by etching and remains. In addition, in some embodiments, the profile of the hole defined in the patterning process exceed the profile of the opening 108, so that the holes 130a and 130b expose a part of the uppermost insulating layers 104 of the stack structure SK1.

Referring to FIG. 2C and FIG. 3C, conductive pillars 132a and 132b are formed in the holes 130a and 130b. The conductive pillars 132a and 132b may serve as source and drain pillars, respectively, and are electrically connected to the channel pillar 116. The method of forming the conductive pillars 132a and 132b includes forming a conductive material on the insulating filling layer 124 and in the holes 130a and 130b, and performing an etch-back process. A material of the conductive pillars 132a and 132b include doped polysilicon.

Figure 3D:
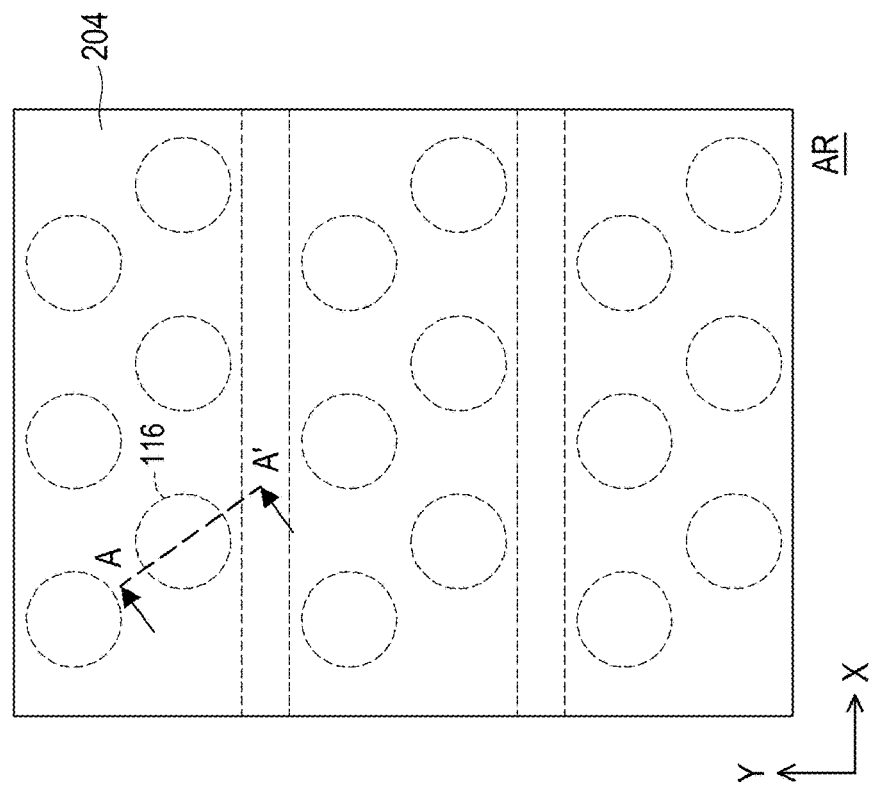

Referring to FIG. 2D and FIG. 3D, a stack structure SK2 is formed on the stack structure SK1. The stack structure SK2 may be composed of insulating layers 204 and an interlayer 206 that are alternately stacked in order. The insulating layer 204 is, for example, a silicon oxide layer. The interlayer 206 is, for example, a silicon nitride layer. The interlayer 206 may serve as a sacrificial layer to be removed entirely or partially in a subsequent process. In this embodiment, the stack structure SK2 has two insulating layers 204 and one interlayer 206, but the disclosure is not limited thereto. In other embodiments, more insulating layers 204 and interlayer 206 are formed according to the requirements.

Next, referring to FIG. 2E and FIG. 3E, a patterning process (e.g., photolithography and etching processes) is performed to form holes 230a and 230b in the stack structure SK2. In this embodiment, in a top view, the holes 230a and 230b have a circular profile, but the disclosure is not limited thereto. In other embodiments, the holes 230a and 230b may have other profile such as a polygonal profile (not shown). The profiles of the holes 230a and 230b are defined by the patterning process, and thus the bottom surfaces of the holes 230a and 230b may expose the conductive pillars 132a and 132b. In addition, the profiles of the holes 230a and 230b defined by the patterning process may further expose the channel pillar 116.

Figure 3F:
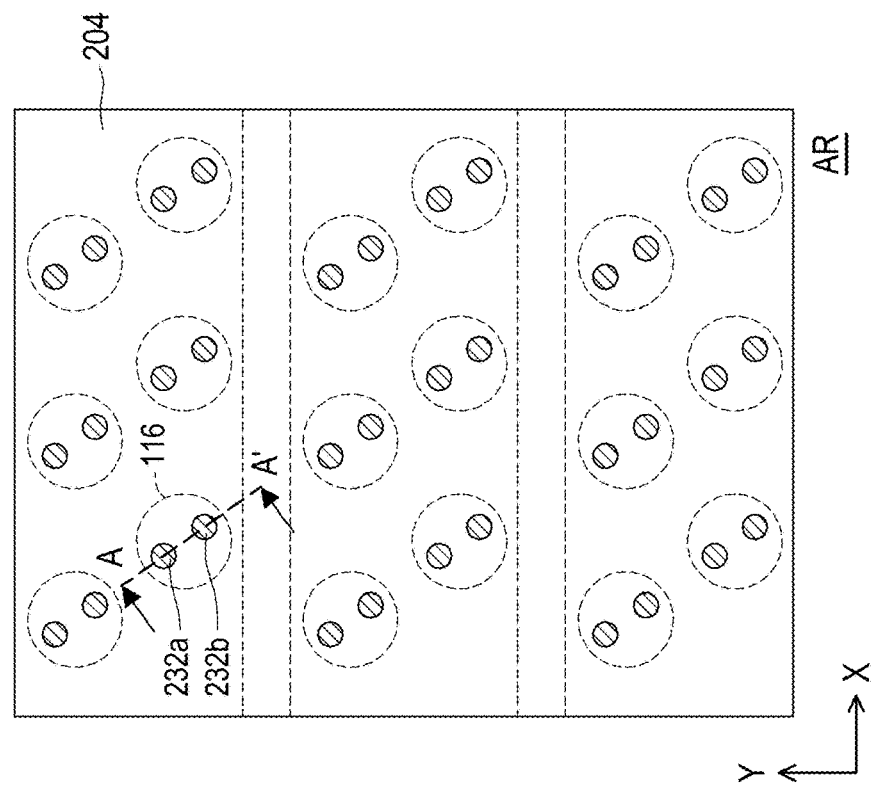
Figure 4A:
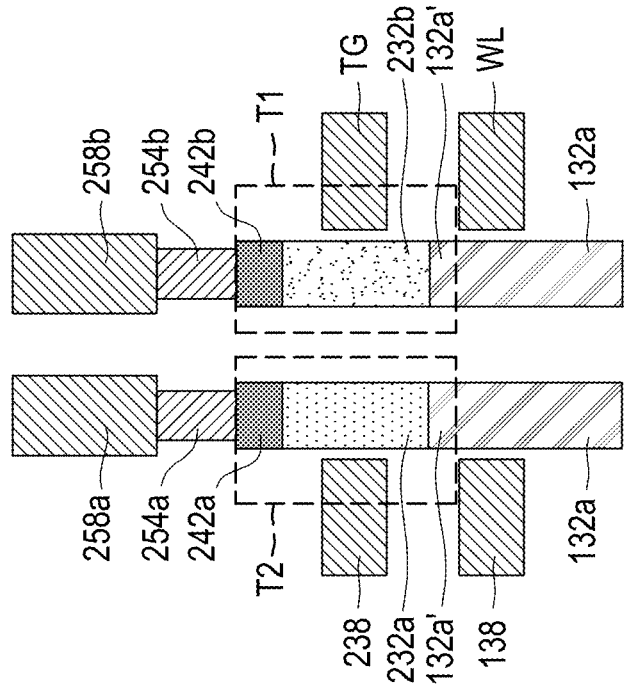
Figure 4B:
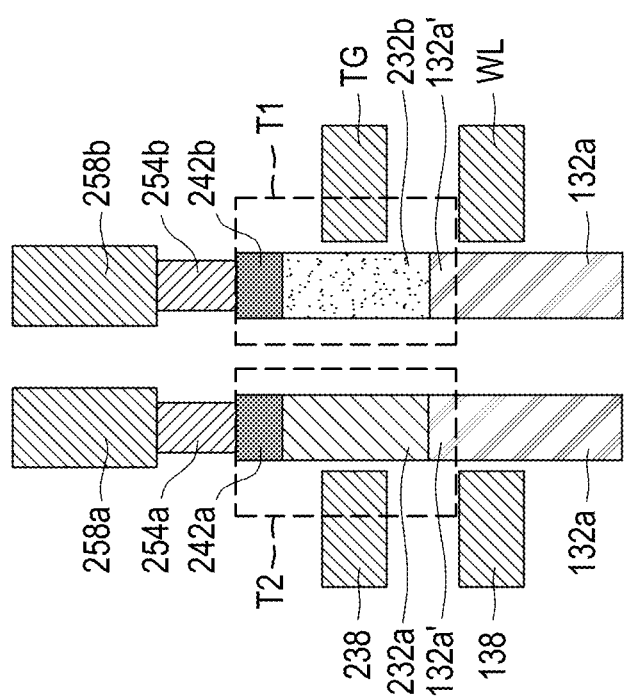

Referring to FIG. 2F and FIG. 3F, conductive plugs 232a and 232b are formed in the holes 230a and 230b. The conductive plugs 232a and 232b may be formed by forming a conductive layer on the stack structure SK2 and in the holes 230a and 230b and etching back the conductive layer. In some embodiments, the conductive plugs 232a and 232b are, for example, undoped polysilicon. However, the disclosure is not limited thereto. In other embodiments, one of the conductive plugs 232a and 232b may have a dopant, as shown in FIG. 4A and FIG. 4C. Alternatively, both conductive plugs 232a and 232b have dopants, as shown in FIG. 4B and FIG. 4D. In FIG. 4B, the conductive plugs 232a and 232b have different dopants. In FIG. 4D, the conductive plugs 232a and 232b have the same dopant.

In some embodiments, the conductive plugs 232a and 232b and the conductive pillars 132a and 132b are solid pillars extending in the Z direction. The conductive plugs 232a and 232b may respectively land on and be electrically connected with the conductive pillars 132a and 132b. The conductive plugs 232a and 232b and the conductive pillars 132a and 132b may have a same size or different sizes. The shape of the conductive plugs 232a and 232b is different from the shape of the channel pillars 116. The conductive plugs 232a and 232b are solid columns extending in the Z direction, and the channel pillar 116 are hollow columns extending in the Z direction. The conductive plugs 232a and 232b are enclosed within the outer sidewalls of the channel pillars 116. The conductive plugs 232a and 232b may or may not be in contact with the top surface of the channel pillars 116.

Referring to FIG. 2G to FIG. 2J and FIG. 3G to FIG. 3J, a replacement process is performed to replace the interlayers 206 with a plurality of gate dielectric layers 214 and a plurality of gate layers 238, and replace the interlayers 106 with a plurality of gate layers 138 and a plurality of charge storage structures 140 and so on. First, referring to FIG. 2G and FIG. 3G, a patterning process (e.g., photolithography and etching processes) is performed on the stack structures SK2 and SK1 to form a plurality of isolation trenches 133. During the etching process, the conductive layer 103 may serve as an etching stop layer, so that the conductive layer 103 is exposed by the isolation trench 133.

Figure 3G:
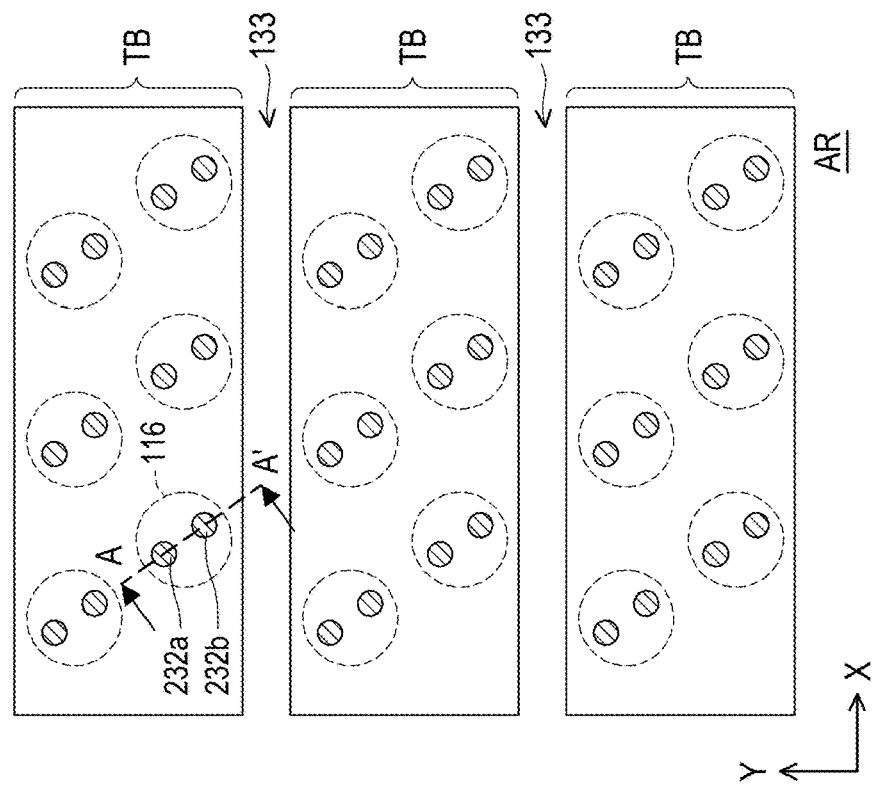
Figure 2G:
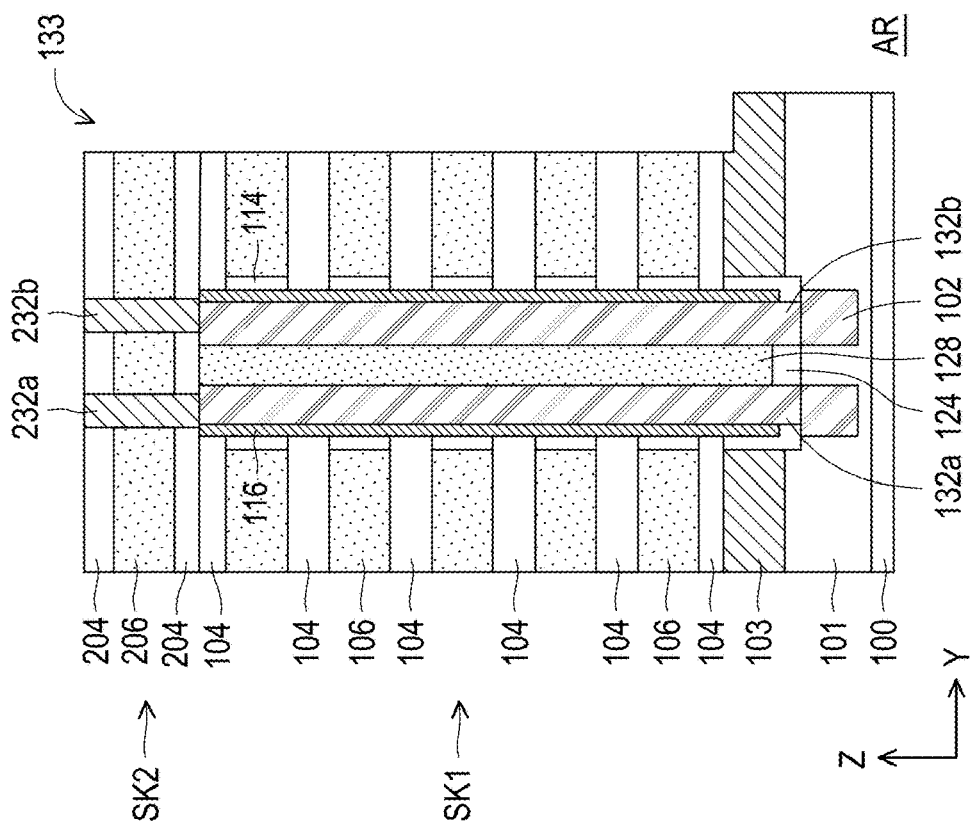

Referring to FIG. 3G, the isolation trench 133 extends along X direction, so that the stack structures SK2 and SK1 in the array region AR and the staircase region (not shown) are divided into a plurality of blocks TB1, TB2, and TB3.

Figure 3H:
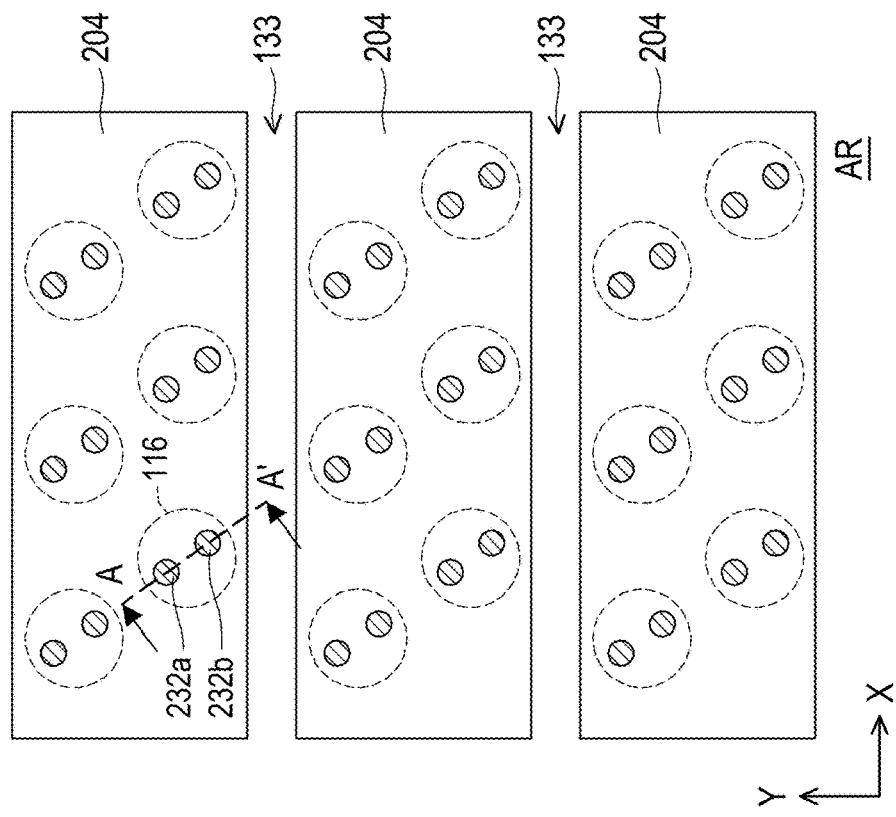

Next, referring to FIG. 2H and FIG. 3H, an etching process (e.g., a wet etching process) is performed, to partially remove the interlayers 206 and 106. The etching solution (e.g., hot phosphoric acid) used in the etching process is injected into the isolation trench 133, and thus potions of the interlayers 206 and 106 which are in contact with the etching solution are removed. During the etching process, when the interlayers 206 and 106 are removed, the conductive plugs 232a, 232b and the tunneling layer 114 may serve as stop layers since materials of the insulating layer 104, the conductive plugs 232a, 232b and the tunneling layer 114 are different from materials of the interlayers 206, 106. By using a time mode control, most of the interlayers 206 and 106 may be removed to form a plurality of horizontal openings 234 and 134. The horizontal openings 134 are spaces outside the channel pillars 116. The horizontal openings 234 include spaces outside the conductive plugs 232a, and 232b and between the conductive plugs 232a, and 232b.

Figure 3I:
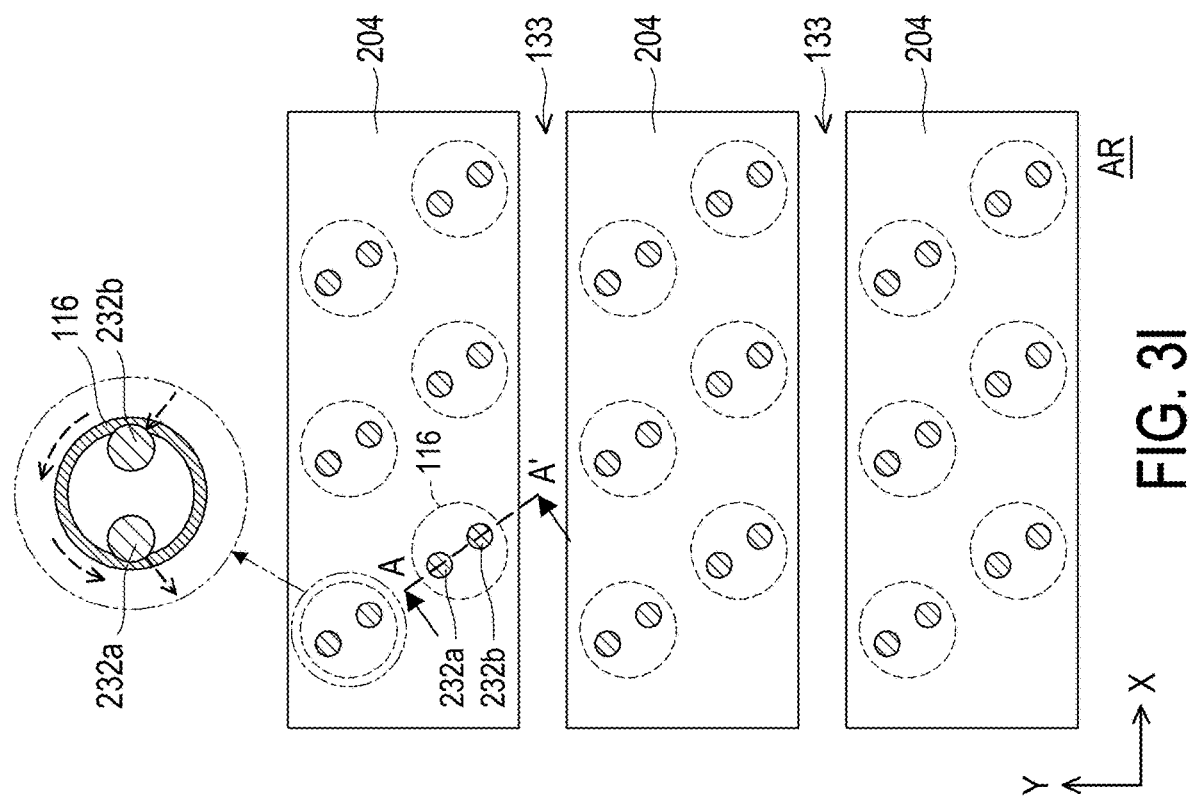

Referring to FIG. 2I and FIG. 3I, first portions P1 (shown in FIG. 1J) of gate dielectric layers 214a and 214b are respectively formed on the sidewalls of the conductive plugs 232a and 232b exposed by the horizontal openings 234. A material of the first portion P1 of the gate dielectric layer 214a and 214b is, for example, silicon oxide, and the forming method thereof is, for example, a thermal oxidation process. That is, the first portion P1 of the gate dielectric layer 214a, 214b covers and contacts a middle portion of the sidewall of the conductive plug 232a, 232b, and upper and lower portions of the sidewall of the conductive plug 232a, 232b are covered and contacted by the insulating layers 204 rather than the first portion P1 of the gate dielectric layer 214a, 214b. The first portion P1 of the gate dielectric layer 214a, 214b and the tunneling layer 114 are separated by the insulating layers 204 and 104, and thus the gate dielectric layer 214a, 214b is not connected with the tunneling layer 114. In other words, the gate dielectric layer 214a, 214b is discontinuous with the tunneling layer 114.

Figure 3J:
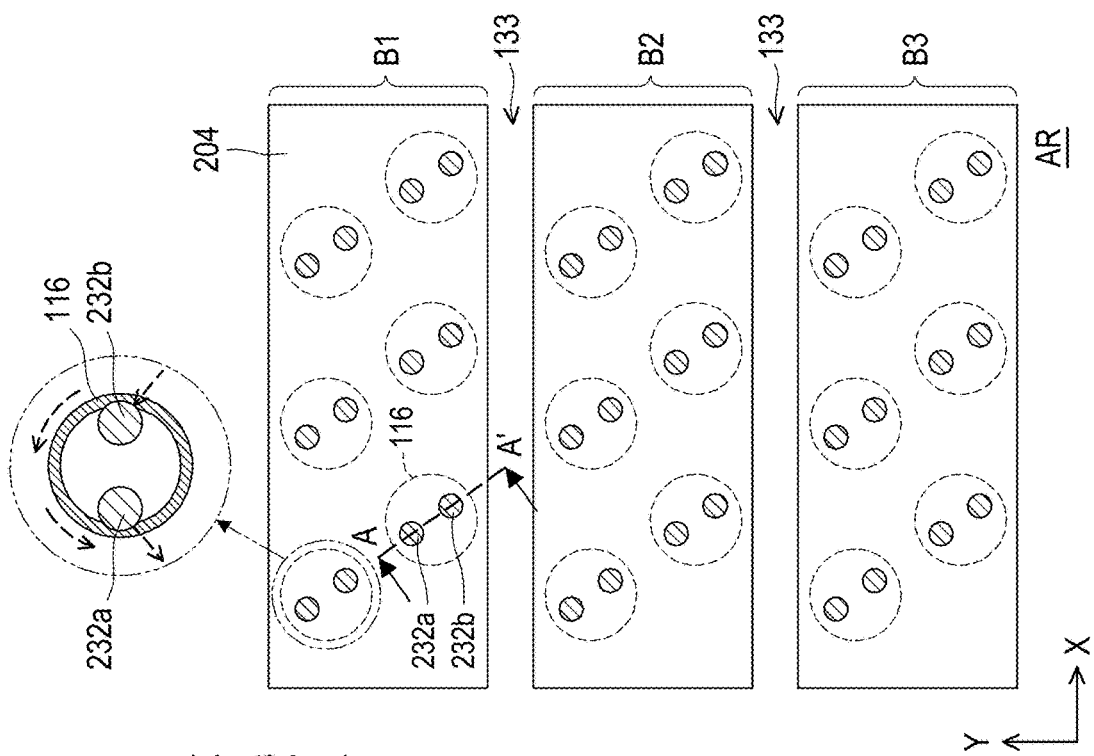

Referring to FIG. 2J and FIG. 3J, second portions P2 of the gate dielectric layers 214a and 214b and gate layers 238 are formed in the horizontal openings 234, and storage layers 112, blocking layers 136 and gate layers 138 of the charge storage structures 140 are formed in the horizontal openings 134. The second portion P2 of the gate dielectric layer 214a, 214b may include multiple layers, such as a first layer P21 and a second layer P22. The first layer P21 may have the same material as the storage layer 112. The second layer P22 may have the same material as the blocking layer 136.

The first layer P21 and the storage layer 112 include, for example, silicon oxynitride, silicon nitride, or a combination thereof. The second layer P22 and the blocking layer 136 include, for example, silicon oxide, a material with high dielectric constant greater than or equal to 7, or a combination thereof. The material with high dielectric constant greater than or equal to 7 may be aluminum oxide ($Al_2O_3$), hafnium oxide ($HfO_2$), lanthanum oxide ($La_2O_5$), a transition metal oxide, a lanthanide oxide, or combinations thereof. The gate layers 238 and 138 include, for example, tungsten. In some embodiments, barrier layers 237 and 137 are further formed before forming the gate layers 238 and 138. A material of the barrier layers 237 and 137 is, for example, titanium (Ti), titanium nitride (TiN), tantalum (Ta), tantalum nitride (TaN) or a combination thereof.

The forming method of the storage layer 112, the blocking layer 136, the barrier layer 137 and the gate layer 138 includes, for example, sequentially forming a storage material, a blocking material, a barrier material and a conductive material in the isolation trench 133 and the horizontal opening 134, and then performing an etch-back process to remove the storage material, the blocking material, the barrier material and the conductive material in the isolation trench 133, so as to form the storage layer 112, the blocking layer 136, the barrier layer 137 and the gate layer 138 in the horizontal opening 134. The blocking layer 136, the tunneling layer 114 and the storage layer 112 are collectively referred to as the charge storage structure 140. The barrier layer 137 and the gate layer 138 serve as a plurality of word lines WL_1, WL_2, WL_3, WL_4, and WL_5 of the memory array. The multiple gate layers 138 and the multiple insulating layers 104 form a gate stack structure 150. The gate stack structure 150 includes a plurality of memory cells. These memory cells are connected in parallel with each other through the conductive pillars 132a and 132b, so as to form a memory string.

During the formation of the storage material, the barrier material, the barrier material and the conductor material in the horizontal opening 134, the above materials may be simultaneously formed in the horizontal opening 234, so as to form the first layer P21 and the second layer P22 of the gate dielectric layers 214a and 214b, the barrier layer 237 and the gate layer 238. The first layer P21 and the second layer P22 form the second portion P2. The first portion P1 and the second portion P2 together form the gate dielectric layers 214a and 214b. The gate dielectric layer 214a and the gate layer 238 surround the conductive plug 232a. The gate dielectric layer 214b and the gate layer 238 surround the conductive plug 232b. In addition, gate dielectric layers 214a and 214b and gate layer 238 are also located between conductive plugs 232a and 232b.

The gate layer 238 may serve as a switch. Furthermore, the gate layer 238 may also be referred to as a top gate TG since it is located above the memory array.

Figure 3K:
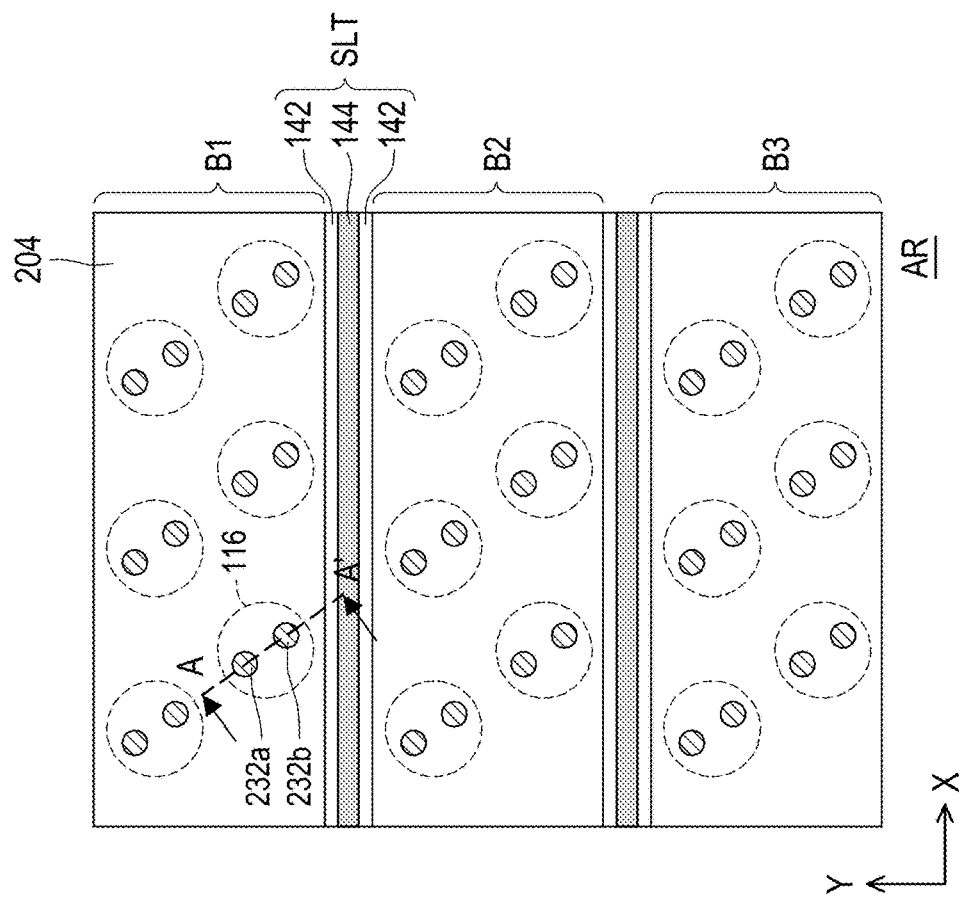
Figure 2K:
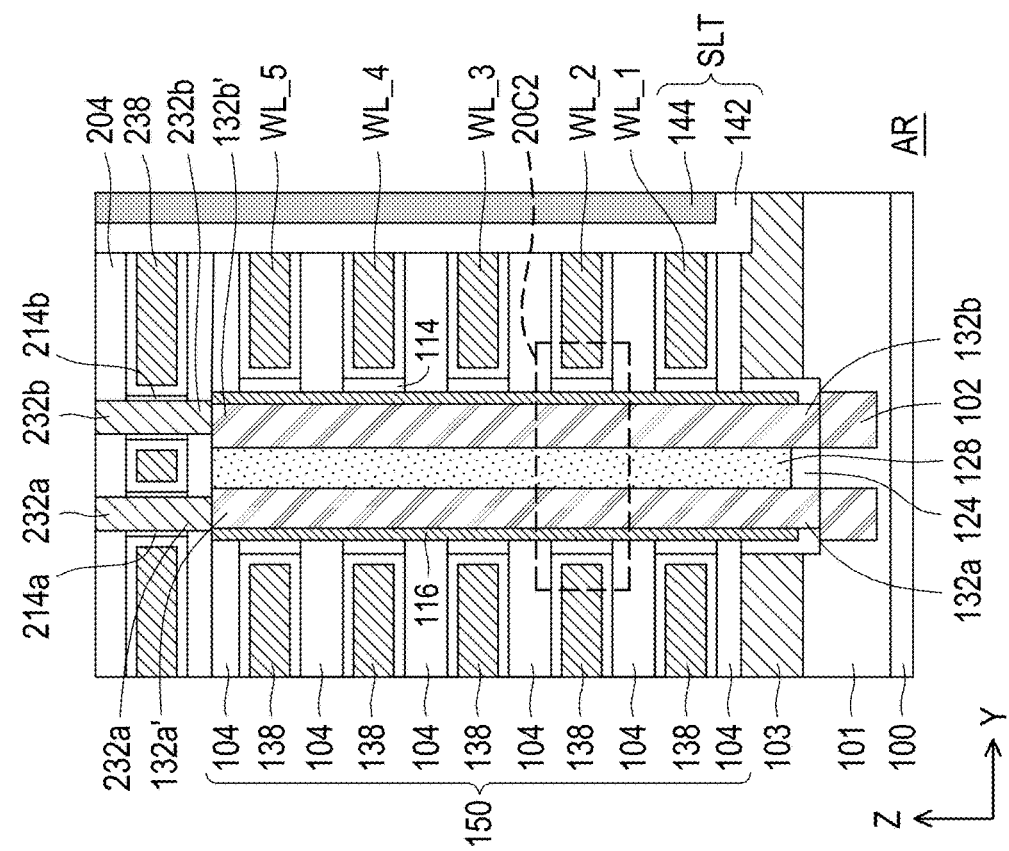

Referring to FIG. 2K and FIG. 3K, an isolation slit structure SLT is formed in the isolation trench 133. The gate stack structure 150 is divided into a plurality of blocks B1, B2, B3 by the isolation slit structure SLT. In some embodiments, the isolation slit structure SLT may include an insulating layer 142 and a filling layer 144. The filling layer 144 may provide sufficient support, so as to avoid bending of the isolation slit structure SLT. The insulating layer 142 includes, for example, silicon oxide, and the filling layer 144 includes, for example, polysilicon. The forming method of the isolation slit structure SLT includes filling an insulating material and a filling material on the gate stack structure 150 and in the isolation trench 133, and then removing the excess insulating and filling materials on the insulating layer 204 through an etch-back process or a planarization process.

Figure 3L:
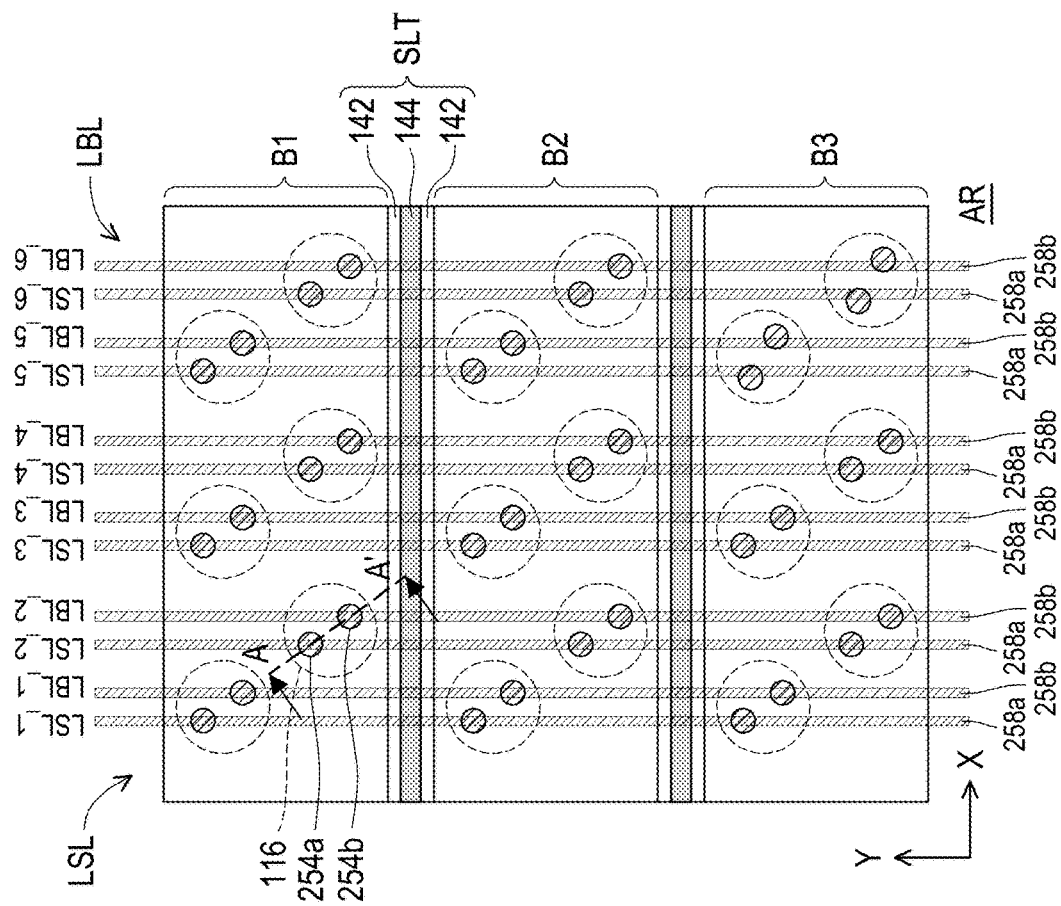
Figure 2L:
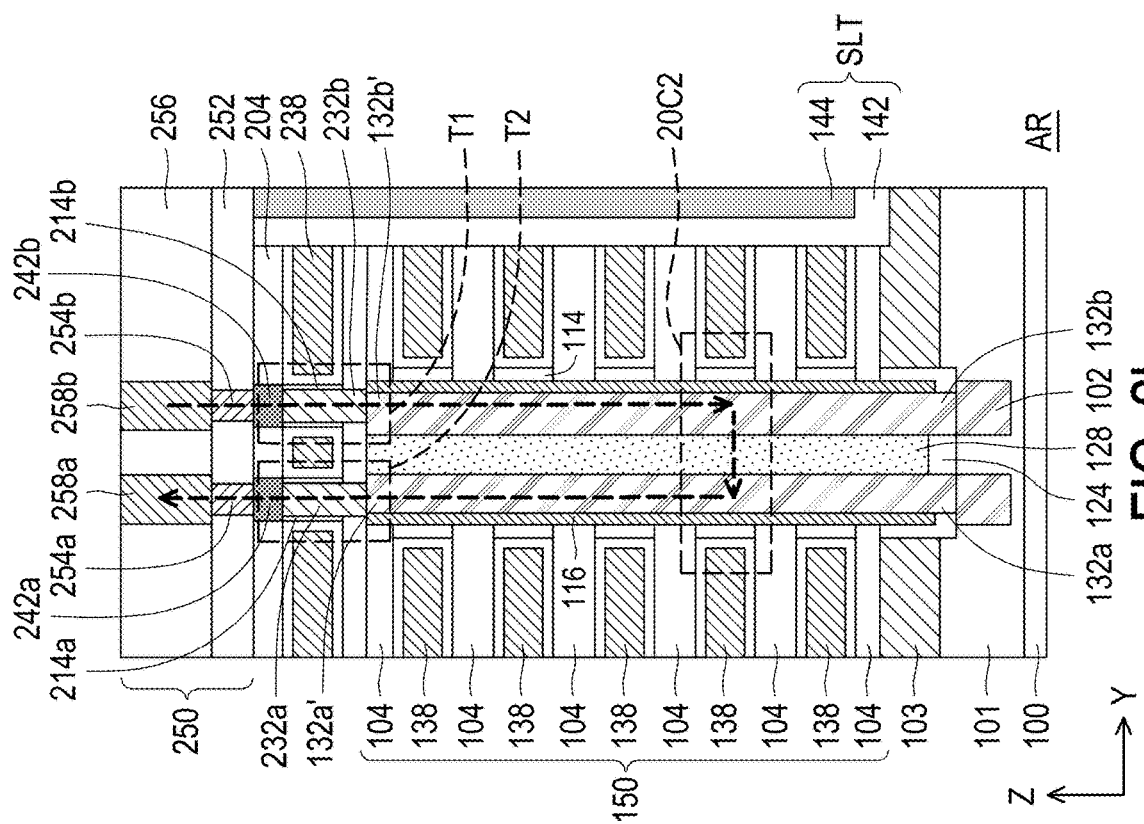

Referring to FIG. 2L and FIG. 3L, doping regions 242a and 242b are formed on the upper portions of the conductive plugs 232a and 232b. The method of forming the doping regions 242a, 242b may include the following steps. A mask layer (not shown) is formed over the dielectric substrate 100. The mask layer has openings to at least expose the conductive plugs 232a and 232b. Then, an ion implantation process is performed to implant dopants into the conductive plugs 232a, 232b. After that, the mask layer is removed. In some embodiments, the dopants in the doping regions 242a, 242b have the same conductivity type (e.g., N-type) as the dopants in the conductive pillars 132a, 132b. The N-type dopant may be phosphorus or arsenic. The conductive plugs 232a and 232b below the doping regions 242a and 242b are also referred to as channel plugs, which may serve as the channel regions of the transistors T2 and T1.

At this stage, the transistors T2 and T1 are formed. The transistors T2 and T1 are vertical transistors. The transistor T2 includes the gate layer 238, the gate dielectric layer 214a, the conductive plug 232a, the doping region 242a, and an upper portion 132a' of the conductive pillar 132a. The doping region 242a and the upper portion 132a' of the conductive pillar 132a serve as source and drain regions of the transistor T2. The transistor T1 includes the gate layer 238, the gate dielectric layer 214b, the conductive plug 232b, the doping region 242b, and an upper portion 132b' of the conductive pillar 132b. The doping region 242b and the upper portion 132b' of the conductive pillar 132b serve as drain and source regions of the transistor T1. The gate layers 238 of the transistors T2 and T1 surround the conductive plugs 232a and 232b (serving as channel regions). Therefore, the transistors T1 and T2 may also be referred to as all-around transistors.

Referring to FIG. 2L and FIG. 3L, an interconnect 250 is formed on the dielectric substrate 100. The interconnect 250 includes a dielectric layer 252, contacts 254a, 254b, a dielectric layer 256, and conductive lines 258a, 258b. A material of the dielectric layers 252 is, for example, silicon oxide. A material of the contacts 254a, 254b and the conductive lines 258a, 258b includes a metal such as tungsten or copper. The contacts 254a, 254b and the conductive lines 258a, 258b may be formed through a single damascene or dual damascene process. The conductive lines 258a and 258b may serve as source lines LSL (e.g., LSL_1, LSL_2, LSL_3, LSL_4, LSL_5, LSL_6) and bit lines LBL (e.g., LBL_1, LBL_2, LBL_3, LBL_4, LBL_5, LBL_6), to electrically connect to the transistors T2 and T1 of different blocks B1, B2 and B3 through the contacts 254a, 254b respectively.

In some embodiments, the conductive line 258a serves as the source line LSL, the doping region 242a is the source region of the transistor T2, the upper portion 132a' of the conductive pillar 132a is the drain region of the transistor T2, and the conductive pillar 132a serves as the source pillar of the memory array. The conductive line 258a is electrically connected to the source pillar (e.g., the conductive pillar 132a) of the memory array through the contact 254a, the source region (e.g., the doping region 242a) of the transistor T2, the conductive plug 232a, and the drain region (e.g., the upper portion 132a' of the conductive pillar 132a) of the transistor T2.

The conductive line 258b serves as the bit line LBL, the doping region 242a is the drain region of the transistor T1, the upper portion 132b' of the conductive pillar 132b is the source region of the transistor T1, and the conductive pillar 132b is the drain pillar of the memory array. The conductive line 258b is electrically connected to the source pillar (e.g., the conductive pillar 132b) of the memory array through the contact 254b, the source region (e.g., the doping region 242b) of the transistor T1, the conductive plug 232b, and the source region (e.g., the upper portion 132b' of the conductive pillar 132b) of the transistor T1.

When the memory device is operated, for example, the data of the memory cell 20C2 of block B2 is selected to be read, in addition to applying a voltage (e.g., 1.2-1.8 volts) to the bit line (e.g., LBL_2) and applying a voltage (e.g., 7 volts) to the word line (e.g., WL_2) which correspond to the selected memory cell 20C2, a voltage (e.g., 7 volts) is applied to the gate layer 238 of the transistor T1 and the transistor T2 which is connected to the drain pillar (e.g., the conductive pillar 132b) of the selected memory cell 20C2. Furthermore, the transistors T1 and T2 of unselected blocks B1 and B3 are turned off (e.g., applying 0 volts or negative voltage to the gate layer 238), and thus unselected word lines (e.g., the word lines WL_1 and WL_3~WL_5), unselected bit lines (e.g., the bit lines LBL_1 and LBL_3~LBL_6) and the common source line are maintained at 0 volts or negative voltage. During the operation, the current flows from the bit line (e.g., LBL_2) to the drain pillar (e.g., the conductive pillar 132b) of the memory array through the open channel region (e.g., the conductive plug 232b) of the transistors T1. The current further flows to the source pillar (e.g., the conductive pillar 132a) through the open channel pillar 116, and flows out of the source line LSL_2 through the channel region (e.g., the conductive plug 232a) of the transistor T2.

In some embodiments of the disclosure, the conductive plug 232a serving as the channel region of the transistor T2 may be undoped polysilicon, N-type doped polysilicon or P-type doped polysilicon. The conductive plug 232b serving as the channel region of the transistor T1 may be undoped polysilicon or P-type doped polysilicon. The conductivity types of the conductive plugs 232a and 232b serving as the channel regions of the transistors T2 and T1 may have various combinations, as shown in FIG. 4A to FIG. 4D.

FIG. 4A to FIG. 4E are schematic cross-sectional views of various combinations of transistors disposed above the memory array in according to an embodiment of the present disclosure.

Referring to FIG. 4A, the conductive plug 232a serving as the channel region of the transistor T2 is undoped polysilicon. The doping region 242a and the upper portion 132a' of the conductive pillar 132a serving as the source region and the drain region of the transistor T2 have a N-type dopant. Therefore, the transistor T2 is always turned off, and the channel of the transistor T2 is only open when a proper voltage is applied to the gate layer 238 (e.g., the top gate TG).

The conductive plug 232b serving as the channel region of the transistor T1 is polysilicon with a P-type dopant, and the upper portion 132b' of the conductive pillar 132b and the doping region 242b serving as the source region and the drain region of the transistor T1 have a N-type dopant. The transistor T1 is always turned off, and the channel of the transistor T1 is only open when a proper voltage is applied to the gate layer 238 (e.g., the word line WL). The channel of the transistor T2 may be open by applying a smaller voltage to the gate layer 238 while the channel of the transistor T1 may be open by applying a larger voltage to the gate layer 238.

Referring to FIG. 4B, the conductive plug 232a serving as the channel region of the transistor T2 has polysilicon doped with a N-type dopant. The doping region 242a and the upper portion 132a' of the conductive pillar 132a serving as the source region and the drain region of the transistor T2 also have a N-type dopant. Therefore, the transistor T2 is always turned on.

The conductive plug 232b serving as the channel region of the transistor T1 is polysilicon with a P-type dopant, and the upper portion 132b' of the conductive pillar 132b and the doping region 242b serving as the source region and the drain region of the transistor T1 have a N-type dopant. The transistor T1 is always turned off, and the channel of the transistor T1 is only open when a proper voltage is applied to the gate layer 238 (e.g., the word line WL).

Referring to FIG. 4C, the conductive plug 232a serving as the channel region of the transistor T2 is polysilicon with a N-type dopant. The doping region 242a and the upper portion 132a' of the conductive pillar 132a serving as the source region and the drain region of the transistor T2 also have a N-type dopant. Therefore, the transistor T2 is always turned on.

The conductive plug 232b serving as the channel region of the transistor T1 is undoped polysilicon, and the upper portion 132b' of the conductive pillar 132b and the doping region 242b serving as the source region and the drain region of the transistor T1 have a N-type dopant. The transistor T1 is always turned off, and the channel of the transistor T1 is only open when a proper voltage is applied to the gate layer 238 (e.g., the word line WL). Under the condition of the same size, compared to the transistor T1 of FIG. 4A and FIG. 4B, a smaller voltage is sufficient to open the channel of the transistor T1 of this embodiment.

Referring to FIG. 4D, the conductive plug 232a serving as the channel region of the transistor T2 is polysilicon with a P-type dopant. The doping region 242a and the upper portion 132a' of the conductive pillar 132a serving as the source region and the drain region of the transistor T2 have a N-type dopant. Therefore, the transistor T2 is always turned off, and the channel of the transistor T2 is only open when a proper voltage is applied to the gate layer 238 (e.g., the word line WL). Under the condition of the same size, compared to the transistor T2 of FIG. 4A, a larger voltage is needed to open the channel of the transistor T2 of this embodiment.

The conductive plug 232b serving as the channel region of the transistor T1 is polysilicon with a P-type dopant. The upper portion 132b' of the conductive pillar 132b and the doping region 242b serving as the source and drain regions of the transistor T1 have a N-type dopant. The transistor T1 is always turned off, and the channel of the transistor T1 is only open when a proper voltage is applied to the gate layer 238 (e.g., the top gate TG). Under the condition of the same size, compared to the transistor T1 of FIG. 4C, a larger voltage is needed to open the channel of the transistor T1 of this embodiment.

Figure 4E:
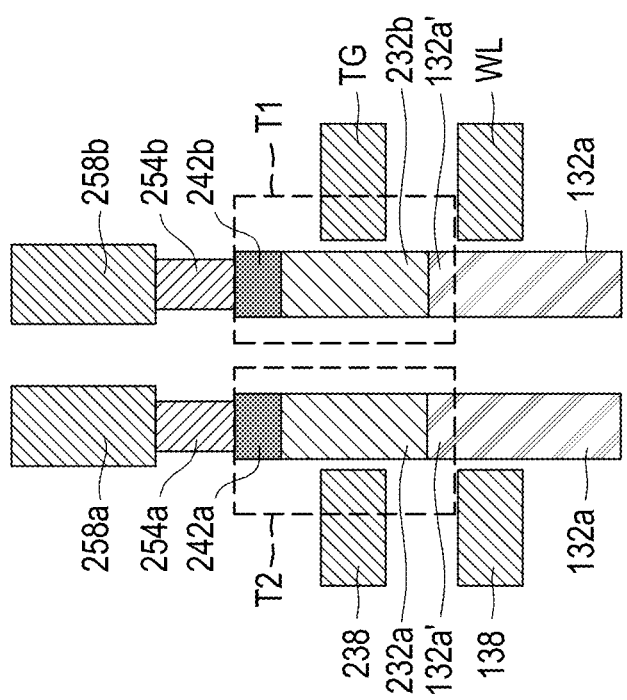

Referring to FIG. 4E, the conductive plug 232a serving as the channel region of the transistor T2 is undoped polysilicon. The doping region 242a and the upper portion 132a' of the conductive pillar 132a serving as the source region and the drain region of the transistor T2 have a N-type dopant. Therefore, the transistor T2 is always turned off, and the channel of the transistor T2 is only open when a proper voltage is applied to the gate layer 238 (e.g., the top gate TG). Under the condition of the same size, compared to the transistor T2 of FIG. 4D, a smaller voltage is sufficient to open the channel of the transistor T2 of this embodiment. Under the condition of the same size, compared to the transistor T2 of FIG. 4B and FIG. 4C, a larger voltage is needed to open the channel of the transistor T2 of this embodiment.

The conductive plug 232b serving as the channel region of the transistor T1 is undoped polysilicon, and the upper portion 132b' of the conductive pillar 132b and the doping region 242b serving as the source region and the drain region of the transistor T1, have a N-type dopant. The transistor T1 is always turned off, and the channel of the transistor T1 is only open when a proper voltage is applied to the gate layer 238 (e.g., the word line WL). Under the condition of the same size, compared to the transistor T1 of F FIG. 4A, FIG. 4B and FIG. 4D, a smaller voltage is sufficient to open the channel of the transistor T1 of this embodiment.

Figure 5:
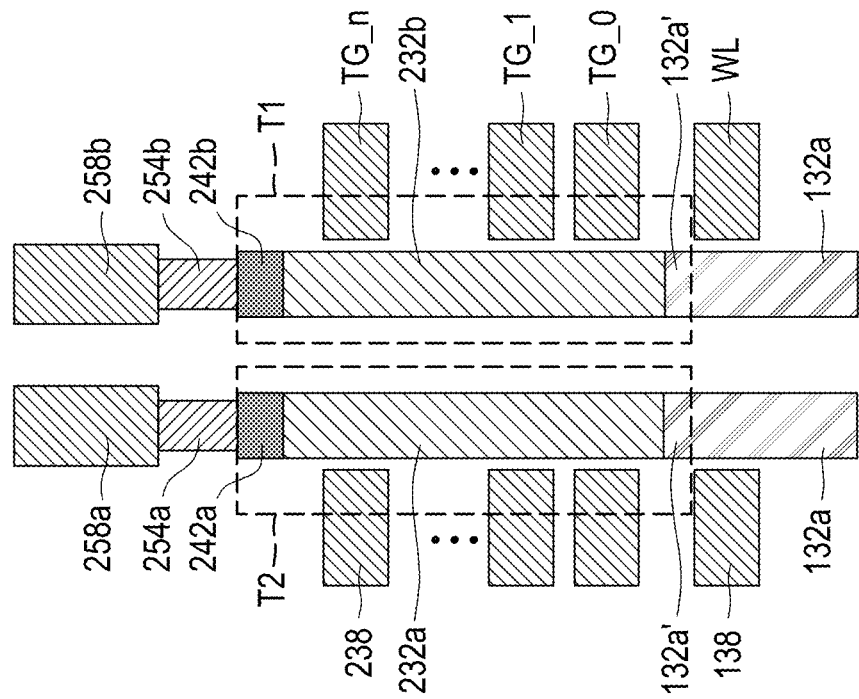
FIG. 5 is a cross-sectional view of a transistor with multiple gates disposed above a memory array in according to an embodiment of the present disclosure.

FIG. 5 is a cross-sectional view of a transistor with multiple gates disposed above a memory array in according to an embodiment of the present disclosure.

Referring to FIG. 4A to FIG. 4D and FIG. 5, in the above embodiments (i.e., FIG. 4A to FIG. 4D), the transistors T1 and T2 respectively have a single gate layer 238 (e.g., the top gate TG). However, in other embodiments (i.e., FIG. 5), the transistors T1 and T2 may have multiple gate layers 238 (i.e., top gates TG_0, TG_1, . . . TG_n), respectively. The multiple gate layers 238 may include dummy gates therein. For example, the channel regions (i.e., the conductive plugs 232a, 232b) of the transistors T2 and T1 are both undoped polysilicon. The dopants in the upper portions 132a' and 132b' of the conductive pillars 132 and 132b may diffuse to the interface of the channel region (i.e., the conductive plugs 232a, 232b) of the top gate TG_0 and the upper portions 132a' and 132b' of the conductive pillars 132a and 132b. Thus, the top gate TG_0 may serve as a dummy gate, and the top gates TG_1 to TG_n above the top gate TG_0 may serve as switch gates.

In addition, each channel region (i.e., the conductive plug 232a, 232b) of the gate layers 238 may be doped according to the requirements, so as to adjust the doping concentration thereof. Accordingly, the gate layers 238 may have a desired initial voltage Vt.

In the embodiment of the disclosure, the transistor disposed on the memory array may serve as a switch for a bit line or a source line. Therefore, read errors may be reduced or avoided.

What is claimed is:

1. A 3D AND flash memory device, comprising:
   a gate stack structure, located on a dielectric substrate, wherein the gate stack structure comprises a plurality of gate layers and a plurality of insulating layers alternately stacked;
   a channel pillar, extending through the gate stack structure;
   a source pillar and a drain pillar, disposed in the channel pillar and electrically connected to the channel pillar;
   a charge storage structure, located between the plurality of gate layers and the channel pillar;
   a first transistor, located above the gate stack structure and electrically connected to the drain pillar; and
   a second transistor, located above the gate stack structure and electrically connected to the source pillar,
   wherein the first transistor comprise a first gate dielectric layer, the second transistor comprises a second gate dielectric layer, and each of the first gate dielectric layer and the second gate dielectric layer comprises a first portion comprising silicon oxide and a second portion comprising a storage material.

2. The 3D AND flash memory device of claim 1, wherein the first transistor and the second transistor are respectively vertical transistors.

3. The 3D AND flash memory device of claim 1, wherein the first transistor and the second transistor are respectively a first all-around transistor and a second all-around transistor.

4. The 3D AND flash memory device of claim 3, wherein the first all-around transformer comprises:
   a first all-around gate, located on the gate stack structure;
   a first channel plug, located on the channel pillar and the drain pillar;
   a first source region, located below the first channel plug and electrically connected to the drain pillar;
   a first drain region, located above the first channel plug and electrically connected to the first channel plug; and
   the first gate dielectric layer, located between the first all-around gate and the first channel plug; and
   the second all-around transistor comprises:
   a second all-around gate, located on the gate stack structure;
   a second channel plug, located on the channel pillar and the source pillar;
   a second drain region, located below the second channel plug and electrically connected to the source pillar;
   a second source region, located above the second channel plug and electrically connected to the second channel plug; and
   the second gate dielectric layer, located between the second all-around gate and the second channel plug.

5. The 3D AND flash memory device of claim 4, wherein the first gate dielectric layer and the charge storage structure are separated from each other, and the second gate dielectric layer and the charge storage structure are separated from each other.

6. The 3D AND flash memory device of claim 4, wherein the first channel plug of the first transistor is an undoped semiconductor or a semiconductor having a dopant with a conductivity type different from a dopant of the first source region.

7. The 3D AND flash memory device of claim 6, wherein the second channel plug of the second transistor is an undoped semiconductor, a semiconductor having a dopant with a conductivity type different from a dopant of the second source region or a semiconductor having a dopant with a conductivity type the same as the dopant of the second source region.

8. The three-dimensional AND flash memory device of claim 1, wherein the first transistor and the second transistor are respectively vertical transistors having a plurality of all-around gates.

9. A 3D AND flash memory device, comprising:
   a first block, comprising:
     a plurality of first memory cells, connected in parallel to form a first memory string;
     a first transistor, connected in series with a drain pillar of the first memory string; and
     a second transistor, connected in series with a source pillar of the first memory string;
   a second block, comprising:
     a plurality of second memory cells, connected in parallel to form a second memory string;
     a third transistor, connected in series with a drain pillar of the second memory string; and
     a fourth transistor, connected in series with a source pillar of the second memory string;
   a bit line, connecting a drain region of the first transistor of the first block and a drain region of the third transistor of the second block; and
   a source line, connecting a source region of the second transistor of the first block and a source region of the fourth transistor of the second block,
   wherein each of the first transistor, the second transistor, the third transistor and the fourth transistor comprises a gate dielectric layer, and the gate dielectric layer comprises a first portion comprising silicon oxide and a second portion comprising a storage material.

10. A method of fabricating a 3D AND flash memory device, comprising:
    forming a first stack structure on a dielectric substrate, wherein the first stack structure comprises a plurality of first interlayers and a plurality of first insulating layers alternately stacked;
    forming a channel pillar extending through the first stack structure;
    forming a source pillar and a drain pillar in the channel pillar to electrically connect to the channel pillar;
    forming a second stack structure on the first stack structure, wherein the second stack structure comprises a plurality of second insulating layers and at least one second interlayer alternately stacked;
    forming a first channel plug and a second channel plug extending through the second stack structure, wherein the first channel plug is landed on and electrically connected to the drain pillar, and the second channel plug is landed on and electrically connected to the source pillar;
    partially removing the plurality of first interlayers and the at least one second interlayer, to form a plurality of first horizontal openings and at least one second horizontal opening;
    forming a gate dielectric layer in the at least one second horizontal opening;
    forming a plurality of first gate layers in the plurality of first horizontal openings and at least one second gate layer in a remaining space of the at least one second horizontal opening;

forming a plurality of charge storage structures between the plurality of first gate layers and the channel pillar; and forming a first doping region in the first channel plug and a second doping region in the second channel plug, wherein the gate dielectric layer comprises a first portion comprising silicon oxide and a second portion comprising a storage material.

11. The method of claim 10, further comprising:

forming a bit line connected to the first doping region; and forming a source line connected to the second doping region.

* * * * *